(12) United States Patent
Reisinger et al.

(10) Patent No.: US 6,194,765 B1
(45) Date of Patent: Feb. 27, 2001

(54) INTEGRATED ELECTRICAL CIRCUIT HAVING AT LEAST ONE MEMORY CELL AND METHOD FOR FABRICATING IT

(75) Inventors: Hans Reisinger, Grünwald; Reinhard Stengl, Stadtbergen, both of (DE); Ulrike Grüning, Wappingers Falls, NY (US); Volker Lehmann, München (DE); Hermann Wendt, Grasbrunn (DE); Josef Willer, Riemerling (DE); Martin Franosch, München (DE); Herbert Schäfer, Höhenkirchen-Sieg Brunn (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/313,433

(22) Filed: May 17, 1999

(30) Foreign Application Priority Data

May 15, 1998 (DE) ................................. 198 21 901

(51) Int. Cl.[7] ..................................................... H01L 29/76
(52) U.S. Cl. .......................... 257/369; 257/334; 257/368; 257/369; 257/371; 257/372; 257/903
(58) Field of Search .................................. 257/368, 369, 257/371, 372, 334, 403

(56) References Cited

U.S. PATENT DOCUMENTS

| | | | |
|---|---|---|---|
| 4,740,826 | * | 4/1988 | Chatterjee ............................. 357/42 |
| 5,398,200 | | 3/1995 | Mazure et al. . |
| 5,414,288 | * | 5/1995 | Fitch et al. ............................ 257/328 |
| 5,612,563 | * | 3/1997 | Fitch et al. ............................ 257/329 |
| 5,670,803 | | 9/1997 | Beilstein, Jr. et al. . |
| 5,808,341 | * | 9/1998 | Maeda et al. ......................... 257/349 |
| 5,952,696 | * | 9/1999 | Gardner et al. ...................... 257/369 |
| 6,043,540 | * | 3/2000 | Matsui et al. ........................ 257/368 |
| 6,081,041 | * | 6/2000 | Kim .................................... 257/903 |

FOREIGN PATENT DOCUMENTS

406112448 * 4/1994 (JP) ..................................... 257/369

* cited by examiner

Primary Examiner—Mahshid Saadat
Assistant Examiner—Edgardo Ortiz
(74) Attorney, Agent, or Firm—Herbert L. Lerner; Laurence A. Greenberg; Werner H. Stemer

(57) ABSTRACT

An integrated electrical circuit has at least one memory cell, in which the memory cell is disposed in the region of a surface of a semiconductor substrate. The memory cell contains at least two inverters that are electrically connected to one another. The inverters each contain two complementary MOS transistors having a source, a drain and a channel, the channels of the complementary MOS transistors having different conductivity types. According to the invention, the integrated electrical circuit is constructed in such a way that the inverters are disposed perpendicularly to the surface of the semiconductor substrate. The source, the drain and the channel of the complementary MOS transistors are formed by layers which lie one on top of the other and are disposed in such a way that the complementary MOS transistors are situated one above the other. The invention furthermore relates to a method for fabricating the integrated electrical circuit.

5 Claims, 21 Drawing Sheets

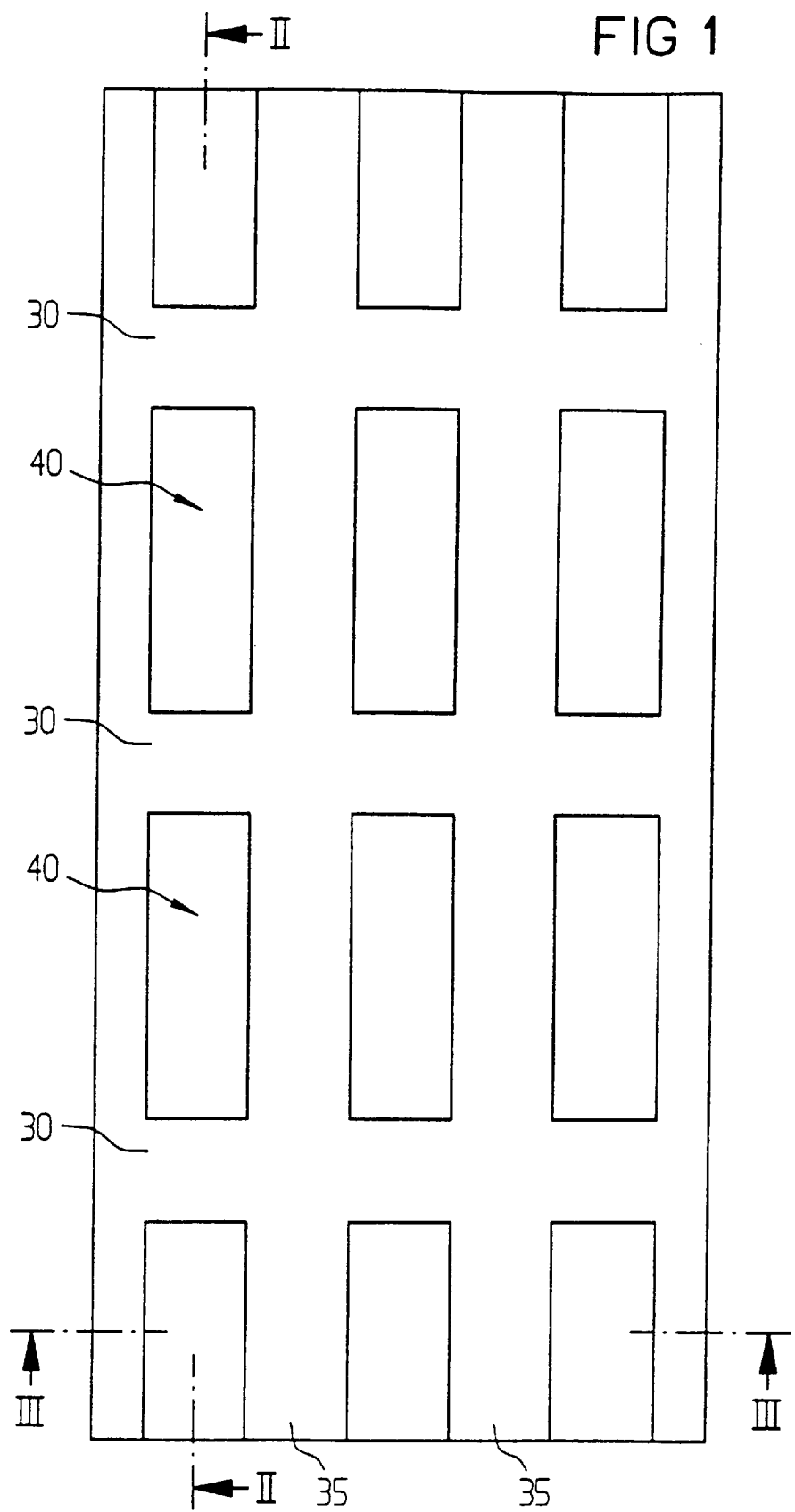

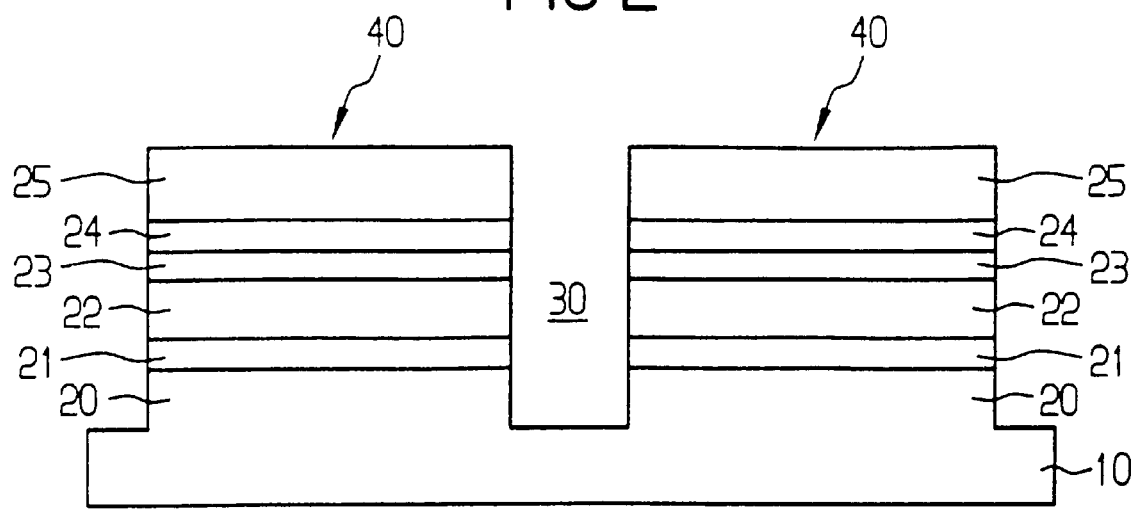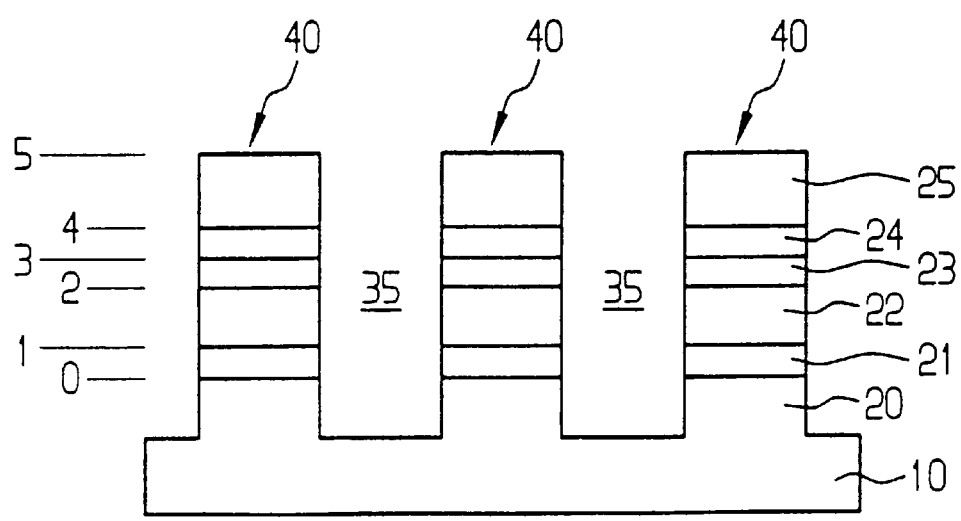

INTEGRATED ELECTRICAL CIRCUIT HAVING AT LEAST ONE MEMORY CELL AND METHOD FOR FABRICATING IT

BACKGROUND OF THE INVENTION

FIELD OF THE INVENTION

The invention relates to an integrated electrical circuit having at least one memory cell, in which the memory cell is disposed in the region of a surface of a semiconductor substrate. The memory cell contains at least two inverters which are electrically connected to one another, the inverters each contain two complementary MOS transistors having a source, a drain and a channel, and the channels of the complementary MOS transistors have different conductivity types.

A static semiconductor memory cell of this type is preferably configured as a bistable flip-flop. The flip-flop has two stable states. Memory cells of this type are distinguished by their short access time, which is of the order of magnitude of a few ns.

Furthermore, the memory cell can be integrated into a CMOS basic process by which the integrated electrical circuit is fabricated. In order to enable random access, the memory cell also contains two bit lines and a word line in addition to the two terminals necessary for the application of an electrical potential. A memory cell of this type is referred to as static random access memory (SRAM).

The static memory cell can be realized in the CMOS basic process without additional process steps. Therefore, it can also be integrated into complex logic circuits such as microprocessors. However, it is likewise possible to construct a memory cell configuration with memory cells of this type. It is also possible to replace DRAMs with SRAMs of this type, and this is advantageous owing to the shorter access time and also owing to the lower activation power.

One disadvantage of SRAMs is the large area that they occupy. Given a minimum feature size F, the memory typically taken up per memory cell is 8 $F^2$ in the case of DRAMs, 60 $F^2$ in the case of SRAMs with a 6-transistor cell or 45 $F^2$ in the case of SRAMs with a cell formed from four transistors and, in addition, two thin film transistors (TFT). A TFT is a MOS transistor with a channel region made of polycrystalline silicon that can be disposed above other transistors.

The minimum feature size F is preferably of the order of magnitude of 0.1 um to 0.5 um, values of 0.18 um to 0.35 um being preferred. However, it is foreseeable that this feature size will be able to be reduced further by a further development of the process technology, in particular of the photolithographic methods used.

Arranging TFTs above other transistors results in vertical integration, which reduces the area requirement. However, an area requirement of 45 $F^2$ remains considerably larger than the area occupation of 8 $F^2$ in the case of DRAMs. A solution to this disadvantage has not been disclosed to date.

SUMMARY OF THE INVENTION

It is accordingly an object of the invention to provide an integrated electrical circuit having at least one memory cell and a method for fabricating it which overcomes the above-mentioned disadvantages of the prior art devices and methods of this general type, in which the space requirement for the memory cell is as small as possible, and to specify a method for fabricating the integrated electrical circuit.

With the foregoing and other objects in view there is provided, in accordance with the invention, an integrated electrical circuit, containing:

a semiconductor substrate having a surface;

a memory cell is disposed in a region of the surface of the semiconductor substrate and has inverters electrically connected to one another, the inverters each contain two complementary MOS transistors each having a source, a drain and a channel, and the channel of each of the two complementary MOS transistors have different conductivity types, the memory cell, including:

a first doped semiconductor layer disposed on the semiconductor substrate;

a second doped semiconductor layer disposed on the first doped semiconductor layer;

a third doped semiconductor layer disposed on the second doped semiconductor layer;

a fourth doped semiconductor layer disposed on the third doped semiconductor layer;

a fifth doped semiconductor layer disposed on the fourth doped semiconductor layer;

and a sixth doped semiconductor layer disposed on the fifth doped semiconductor layer, the first doped semiconductor layer, the second doped semiconductor layer, the third doped semiconductor layer, the fourth doped semiconductor layer, the fifth doped semiconductor layer and the sixth doped semiconductor layer define a layer sequence doped alternately with opposite conductivity types;

the layer sequence has a grid of rectangular trenches formed therein, the grid of rectangular trenches reaches down into the semiconductor substrate and the grid of rectangular trenches defines at least two layer assemblies each having side walls;

the at least two layer assemblies each have a further trench formed therein, the further trench reaches down into the third doped semiconductor layer and connects two mutually opposite rectangular trenches of the grid of rectangular trenches to one another in a respective layer assembly;

the inverters are disposed on mutually opposite side walls of the side walls of the at least two layer assemblies, the first doped semiconductor layer, the second doped semiconductor layer and the third doped semiconductor layer in each case forming the source, the channel and the drain of one of the two complementary MOS transistors of a respective inverter and the fourth doped semiconductor layer, the fifth doped semiconductor layer and the sixth doped semiconductor layer in each case form the source, the channel and the drain of another of the two complementary MOS transistors of the respective inverter;

two selection transistors each have a source, a channel and a drain and are disposed in each case on a side of the respective layer assembly which is remote from the inverters, the source, the channel and the drain of each of the two selection transistors are formed by the third doped semiconductor layer, the fourth doped semiconductor layer and the fifth doped semiconductor layer; and the further trench disposed in the layer sequence in each case are formed between one of the two selection transistors and one of the inverters.

In the integrated electrical circuit, a first doped semiconductor layer, a second doped semiconductor layer, a third doped semiconductor layer, a fourth doped semiconductor layer, a fifth doped semiconductor layer and a sixth doped semiconductor layer are disposed one above the other on a semiconductor substrate and are each doped alternately by the opposite conductivity type. A grid of rectangular trenches which reach down into the semiconductor substrate is provided, which grid defines at least two layer assemblies. A further trench is provided in each case in each of the two layer assemblies, which further trench reaches down into the third doped semiconductor layer and connects two mutually opposite rectangular trenches to one another in the layer assembly. By virtue of the further trench, two separate layer stacks are realized in the layer assembly in the upper region, that is to say in the sixth doped semiconductor layer, fifth doped semiconductor layer, fourth doped semiconductor layer and part of the third doped semiconductor layer.

The circuit contains two inverters that are disposed on mutually opposite side walls of the two layer assemblies. Each of the inverters has a transistor and a transistor that is complementary thereto. The first doped semiconductor layer, the second doped semiconductor layer and the third doped semiconductor layer in each case form the source, the channel and the drain of the transistor and the fourth doped semiconductor layer, the fifth doped semiconductor layer and the sixth doped semiconductor layer form the source, the channel and the drain of the transistor which is complementary thereto. Furthermore, two selection transistors are provided, which are disposed in each case on that side of the respective layer assembly which is remote from the inverter, the source, the channel and the drain of the selection transistors are formed by the third doped semiconductor layer, the fourth doped semiconductor layer and the fifth doped semiconductor layer. The further trench is disposed in the layer assembly in each case between the selection transistor and the inverter.

Since the dimensions of the memory cell are predetermined by the grid of rectangular trenches, the integrated circuit configuration can be fabricated by self-aligning fabrication steps with a high packing density.

In order to enable random access to the memory cell, it is advantageous to provide two bit lines and a word line and also a supply voltage line. In this case, the fifth doped semiconductor layer is connected to one of the bit lines in each case in the region of the selection transistors. The two selection transistors are thus connected to different bit lines. Furthermore, the sixth doped semiconductor layer is connected to the supply voltage line in the region of the inverters. The gate electrodes of the selection transistors are connected to the word line. By driving the word line, the selection transistors can thus be connected to the bit lines.

The gate electrodes of the selection transistors and the gate electrodes of the complementary transistors of the inverters are preferably configured in the form of spacers. At least a portion of the gate electrodes of the selection transistors are disposed in each case in one of the further trenches, and a portion of the gate electrodes of the complementary transistors of the inverters are disposed in one of the rectangular trenches.

With regard to an increased channel width of the selection transistors, it is advantageous for the gate electrodes of the selection transistors to be provided in annular form. The gate electrodes annularly surrounding those parts of the third doped semiconductor layer, of the fourth doped semiconductor layer and of the fifth doped semiconductor layer which form the respective selection transistor. The gate electrodes consequently surround the layer stack that is defined by the further trench in the upper region of the layer assembly and in which the respective selection transistor is disposed.

In accordance with one refinement of the invention, part of the semiconductor substrate is used as the first doped semiconductor layer.

The second doped semiconductor layer, the third doped semiconductor layer, the fourth doped semiconductor layer, the fifth doped semiconductor layer and the sixth doped semiconductor layer are preferably grown epitaxially. With regard to sharp dopant profiles, it is advantageous in this case to dope the semiconductor layers in situ during the epitaxial deposition by adding a corresponding dopant.

Other features which are considered as characteristic for the invention are set forth in the appended claims.

Although the invention is illustrated and described herein as embodied in an integrated electrical circuit having at least one memory cell and a method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, plan view of a semiconductor substrate with a plurality of layers that have been grown, after a patterning of the layers and the production of insulation trenches according to the invention;

FIG. 2 is a cross-sectional view through the semiconductor substrate illustrated in FIG. 1 along the line II—II;

FIG. 3 is a cross-sectional view through the semiconductor substrate illustrated in FIG. 1 along the line III—III;

DESCRIPTION OF THE PREFERRED EMBODIMENTS

Figure 4:
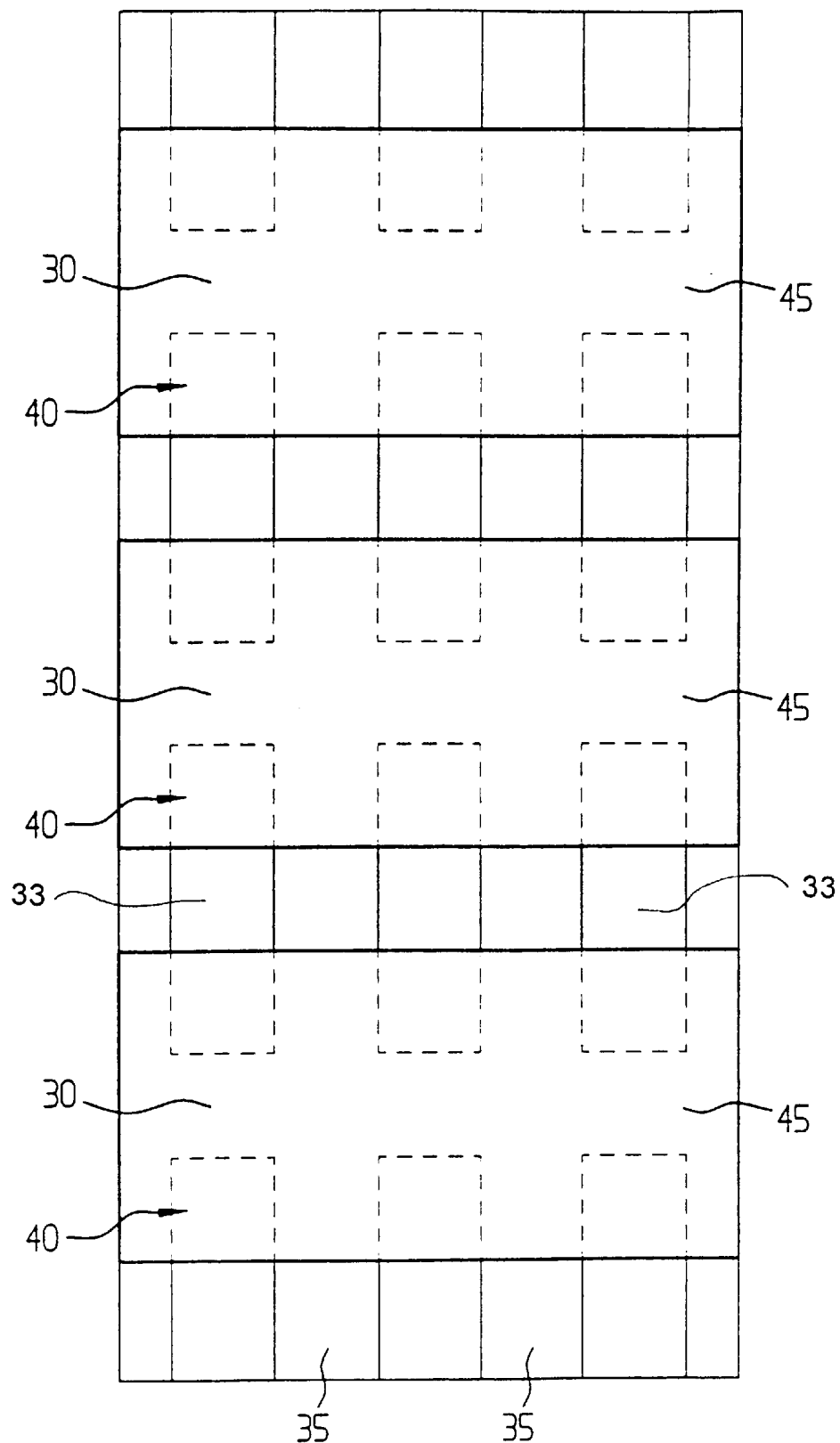
FIG. 4 is a plan view of the semiconductor substrate after the filling of the insulation trenches with an insulation material, application of a resist and exposure.

In all the figures of the drawing, sub-features and integral parts that correspond to one another bear the same reference symbol in each case. Referring now to the figures of the drawings in detail and first, particularly, to FIG. 2 thereof, there is shown semiconductor layers 21, 22, 23, 24 and 25 that are grown epitaxially on a semiconductor substrate 10, for example made of heavily doped, monocrystalline silicon. The semiconductor substrate 10 has a high concentration of an n-type dopant, for example of phosphorus or arsenic of the order of magnitude of $1 \times 10^{18}$ cm$^{-3}$.

First of all, a p-doped layer 21 with a dopant concentration in the region of $1 \times 10^{18}$ cm$^{-3}$ is grown epitaxially on the n$^+$-doped semiconductor substrate 10. An n$^+$-doped layer 22 with the dopant concentration in the region of $1 \times 10^{18}$ cm$^{-3}$ is grown, in turn, on the layer. A p-doped layer 23 with the dopant concentration of $1 \times 10^{18}$ cm$^{-3}$ to $1 \times 10^{19}$ cm$^{-3}$, preferably $1 \times 10^{18}$ cm$^{-3}$, is grown on the layer 22. An n-doped layer 24 with the dopant concentration in the region of $1 \times 10^{18}$ cm$^{-3}$ is grown on the layer 23. As the topmost layer, a p$^+$-doped layer 25 with the dopant concentration in the region of $1 \times 10^{18}$ cm$^{-3}$ to $1 \times 10^{19}$ cm$^{-3}$ is then grown on.

The semiconductor substrate 10 and also the layers 21, 22, 23, 24 and 25 are preferably composed of the same semiconductor material and differ in terms of their chemical composition merely through the concentration of the dopant that they contain.

A resist mask is applied in a subsequent process step. Exposure is then carried out. By anisotropic etching using an etchant that is capable of etching the semiconductor substrate 10 as well as the layers 21, 22, 23, 24 and 25, trenches 30, 35 are produced in a plasma etching process. A suitable etchant is a gas mixture containing hydrogen bromide HBr in combination with chlorine and helium. The etching is carried out at 100 to 500 torr, i.e. at pressures of approximately 130 to approximately 670 millibars and at temperatures of between 10 and 50 degrees Celsius.

The trenches 30, 35 are etched until the trenches 30, 35 penetrate the semiconductor substrate 10. The penetration is of the order of magnitude of 200 nm. The semiconductor substrate 10 and also the layers 21, 22, 23, 24 and 25 are patterned by the etching of the trenches 30, 35. Moreover, a pedestal region 20 for the semiconductor layers 21, 22, 23, 24 and 25 is produced by the patterning of the semiconductor substrate 10. The upper edges of the pedestal region of the semiconductor substrate 10, of the semiconductor layers 21, 22, 23, 24 and 25 define structure planes 0, 1, 2, 3, 4 and 5 (see FIG. 3).

A grid of rectangular trenches 30 and 35 is thus produced. The layers 21, 22, 23, 24 and 25 project from these trenches in the form of layer assemblies 40.

A plan view of a semiconductor substrate that has been treated in such a way is illustrated in FIG. 1. The sequence of the differently doped regions formed by the pedestal region 20 of the semiconductor substrate 10 and also by the layers 21, 22, 23, 24 and 25 and also the position of the trenches 30 and 35 can be discerned in FIG. 1.

The thicknesses of the pedestal region 20 serving to form a source and of the layers likewise serving to form source or drain regions are approximately twice as thick as the layers 21 and 23 forming channel regions. By way of example, the thickness of the pedestal region 20, of the layer 22 and also of the layer 25 is 200 nm, while the thickness of the layers 21, 23 and 24 is approximately 100 nm (see FIGS. 2 and 3).

The trenches 30 and 35 are subsequently filled with a suitable insulating filling material. The chemical composition of the filling material is not critical because it is completely removed in later process steps. However, the material involved must be one that does not attack the layers and does not bring about undesirable diffusion of impurity atoms. Appropriate filling materials are, by way of example, tetraethyl orthosilicate (SiO(OC$_2$H$_5$)$^4$; TEOS), borophosphorus silicate glass (BPSG) or an organic filling material.

A surface of the structure plane 5 is subsequently planarized.

A resist mask 45 that covers the trenches 30 and also a portion of the trenches 35 is subsequently applied. The alignment of the resist mask 45 should be effected with an accuracy of better than 0.2 F (F is the minimum feature size). With a feature size F of 0.5 um, then, a resulting required accuracy for the application of the resist mask is 0.1 um. The resist mask is subsequently exposed. The resulting state of the semiconductor substrate is illustrated in FIG. 4. It is evident from this that the intersections of the trenches 30 and 35 and also the corners of the layer stacks 40 are covered by the resist mask 45.

In the regions which are not covered by the resist mask, the layer stacks are removed to a point below the plane 2 shown in FIG. 3, i.e. the thickness of the layer 22 is also reduced in these regions. Further trenches 33 are formed in the process, which further trenches 33 run parallel to the trenches 30 and in each case connect mutually opposite trenches 35 to one another.

Figure 5:
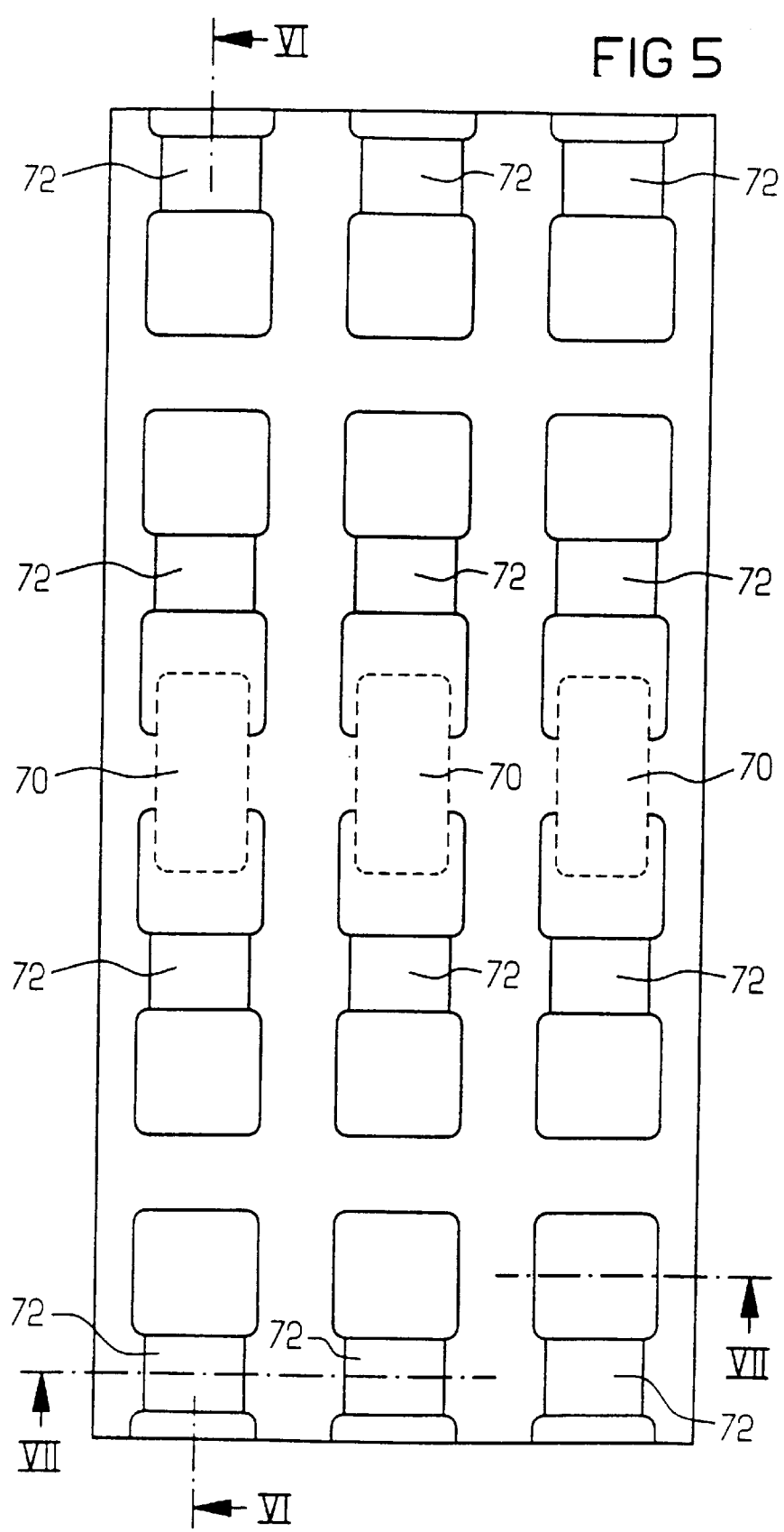
FIG. 5 is a plan view of the semiconductor substrate after a removal of the resist layer, application of a nitride layer, application of a resist and exposure.
Figure 6:
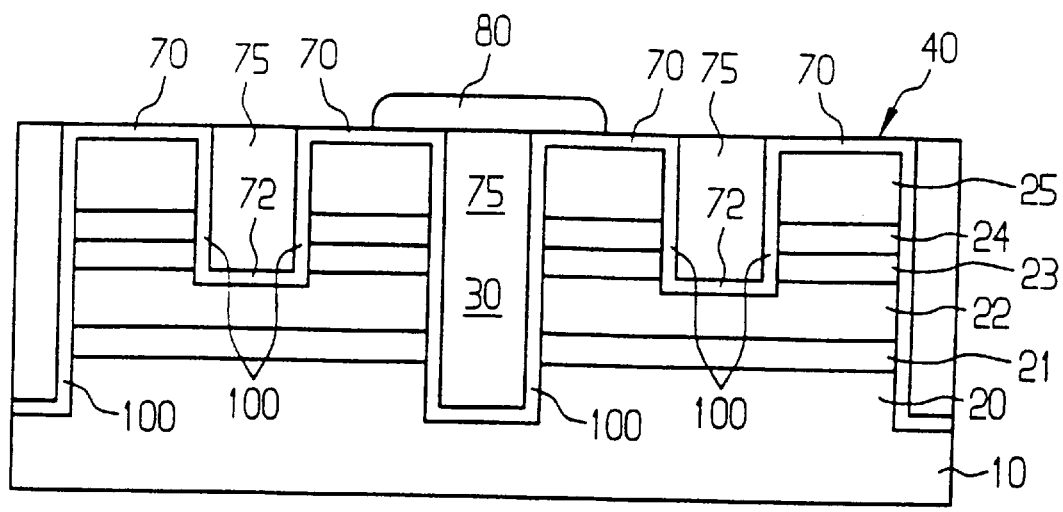
FIG. 6 is a cross-sectional view through the semiconductor substrate illustrated in FIG. 5 along the line VI—VI.
Figure 7:
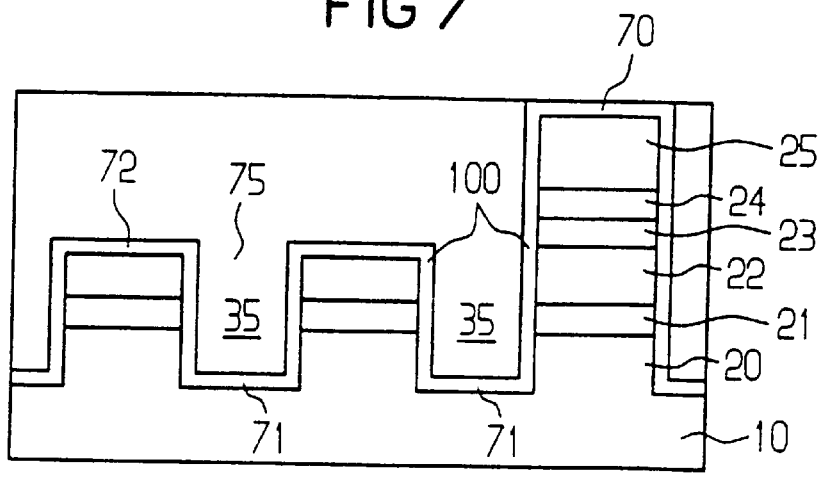
FIG. 7 is a cross-sectional view through the semiconductor substrate illustrated in FIG. 5 along the line VII—VII.

The resist mask is removed after the etching operation. The filling material is then etched selectively with respect to the semiconductor material. The etching operation can be carried out either anisotropically or isotropically, isotropic etching being preferred. In the case where the filling material is tetraethyl orthosilicate (TEOS) and the semiconductor material is silicon, dry etching is suitable. In order to carry out anisotropic dry etching, $CHF_3$, for example, is used as etching gas. Suitable etching gases for isotropic dry etching are $SF_6$ or $CF_4$. Afterwards, a nitride layer 70, 71, 72, for example made of silicon nitride ($Si_3N_4$), is applied to a thickness of approximately 100 nm, preferably in a chemical vapor deposition (CVD) process (see FIGS. 5–6). As a result of this, the entire surface of the trenches 30, 35 and also of the layer stacks 40 including the side areas of the layer stacks 40 is covered with nitride. Afterwards, the trenches 30 and 35 are once again filled with a filling material 75 such as tetraethyl orthosilicate (TEOS) or borophosphorus silicate glass (BPSG). The surface is subsequently planarized, the nitride layer 70 serving as a stop layer for the chemical mechanical planarization (CMP) process used for the planarization. A photoresist is subsequently applied and exposed. The application of the resist mask 80 thereby formed should also be effected with an accuracy of at least 0.2 F. The state of the semiconductor substrate that is reached by these process steps is illustrated in FIGS. 5, 6 and 7. In this case, that part of the nitride layer which is situated on the structure plane 5 is designated by the reference numeral 70, while that part of the nitride layer which is situated on the structure plane 2 is designated by the reference numeral 72 and that part of the nitride layer which is situated on the semiconductor substrate 10 is designated by the reference numeral 71 (see FIG. 7).

Figure 8:
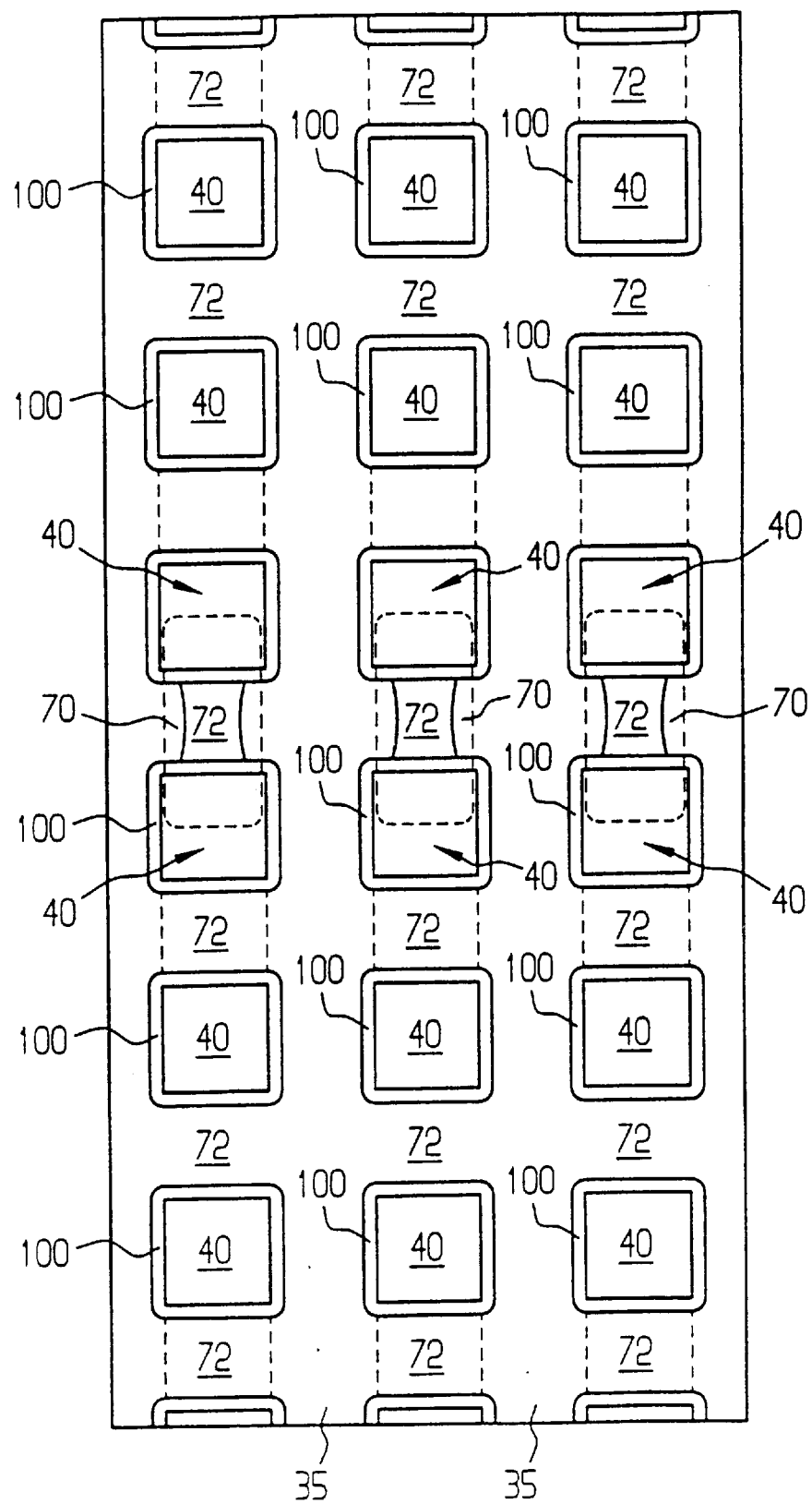
FIG. 8 is a plan view of the semiconductor substrate after the etching of trenches into the insulation material.

The filling material 75 is subsequently etched anisotropically with high selectivity with respect to the nitride layer 70–72. The selectivity of the removal process, i.e. the ratio of the removal rates of the filling material to the removal rate of the nitride layer is preferably greater than 20, for example if the filling material is formed by tetraethyl orthosilicate (TEOS), $CHF_3$ once again being suitable as the etching gas in the event of anisotropic dry etching and $SF_6$ or $CF_4$ once again being suitable as the etching gases in the event of isotropic dry etching. The etching operation stops between planes 1 and 2. Trenches are etched into the filling material 75 as a result of this. A lateral bounding of the etching is effected by nitride side-walls 100 formed beforehand on the semiconductor stacks 40. The horizontal nitride areas, which are also situated on the surfaces of the semiconductor layers 22 and 25, are thinned by the etching process. The resulting state is illustrated in FIG. 8.

In the next process step, the nitride layer 70, 72 is etched anisotropically, the etching parameters preferably being chosen such that 100 nm of the nitride layer 70, 72 are removed. Etching is again carried out. The nitride layer 70, 72 on the surfaces of the layer assemblies 40 is removed as a result of this.

This operation can be understood as wet chemical thinning of the nitride layer, the nitride cover on the layer assemblies 40 being removed.

Afterwards, the resist mask 80 is removed and a further insulation material is deposited. This is preferably done by $SiO_2$ being deposited to a thickness of approximately 100 nm.

Figure 9:
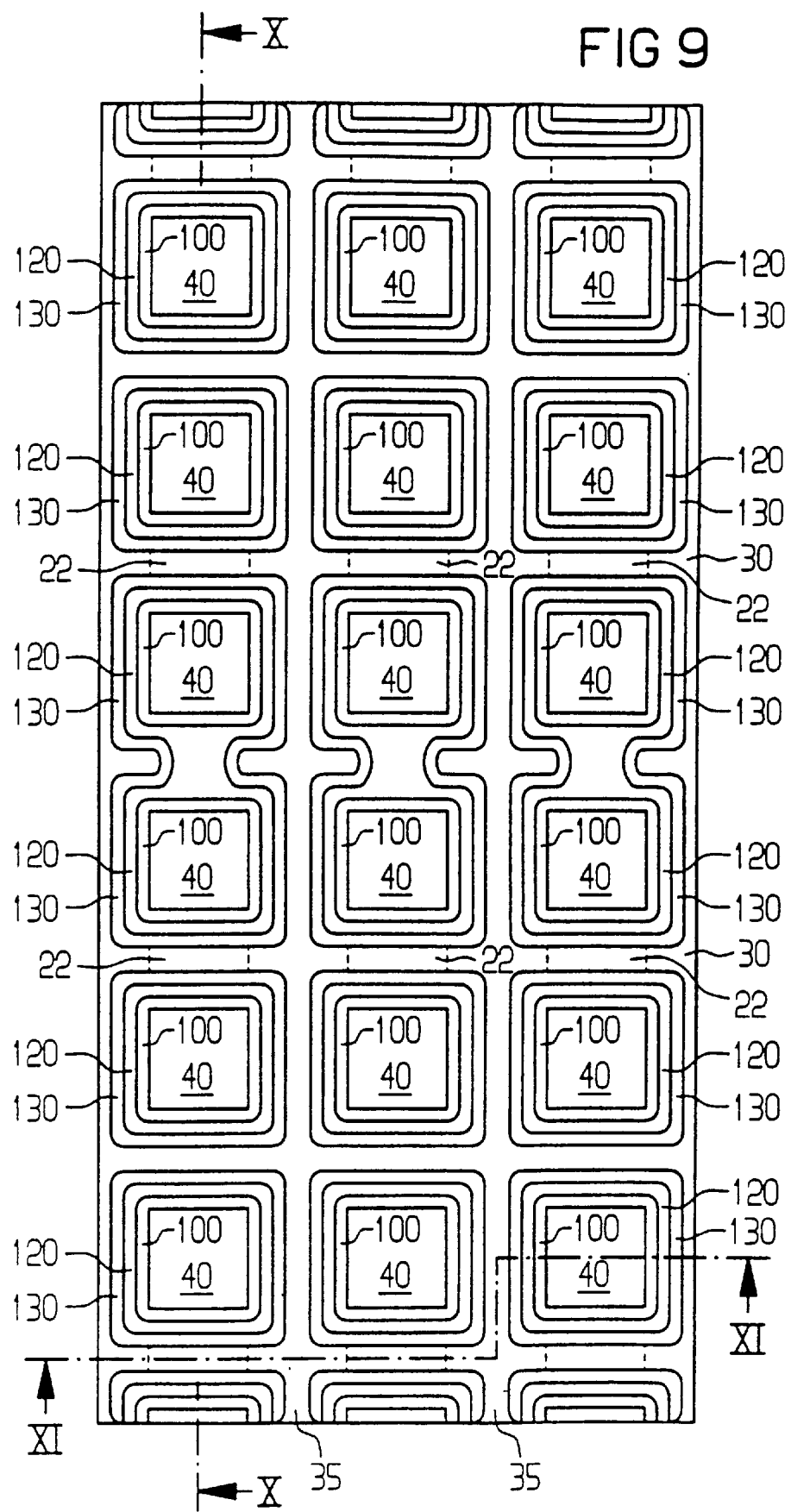
FIG. 9 is a plan view of the semiconductor substrate after the application and etching of a further insulation layer.
Figure 10:
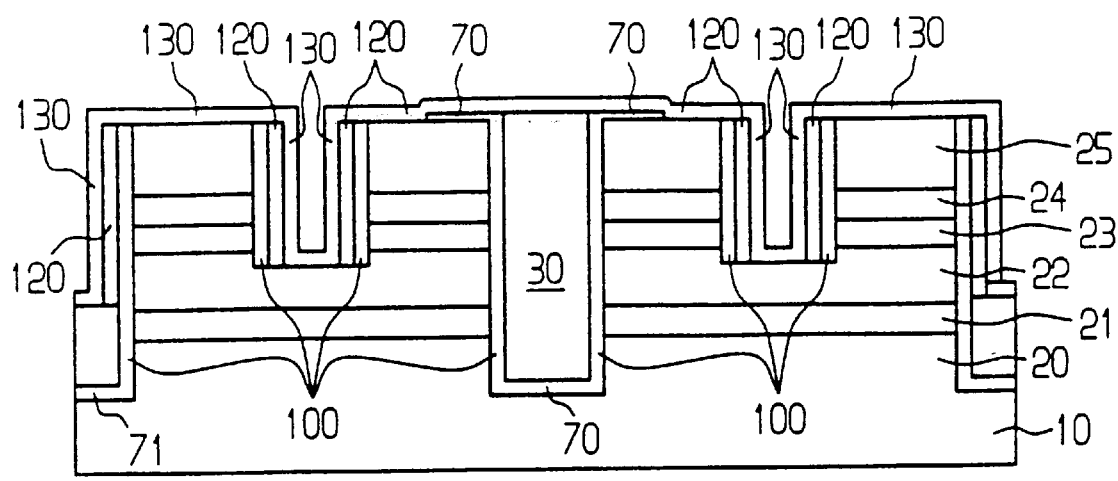
FIG. 10 is a cross-sectional view through the semiconductor substrate illustrated in FIG. 9 along the line X—X.
Figure 11:
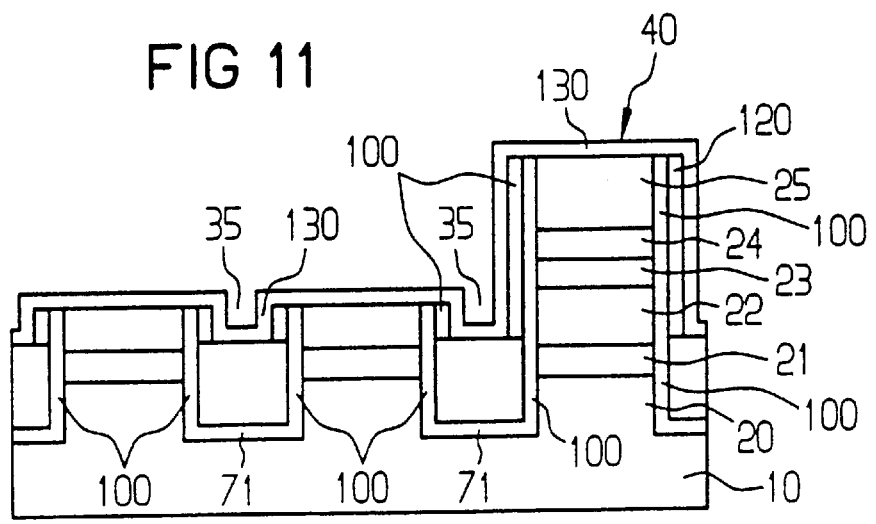
FIG. 11 is a cross-sectional view through the semiconductor substrate illustrated in FIG. 9 along the line XI—XI.

The insulation material is subsequently etched anisotropically in such a way that only spacers 120 are preserved (see FIG. 9). Heavily doped polycrystalline silicon 130, which is preferably $n^+$-doped, is subsequently deposited to a thickness of approximately 100 nm in an atmosphere containing silane $SiH_4$ and phosphorus. As a result of this, electrical contact is established with the $n^+$-doped layer 22 in the trenches 30. This state of the semiconductor substrate is illustrated in FIGS. 9 to 11.

Figure 12:
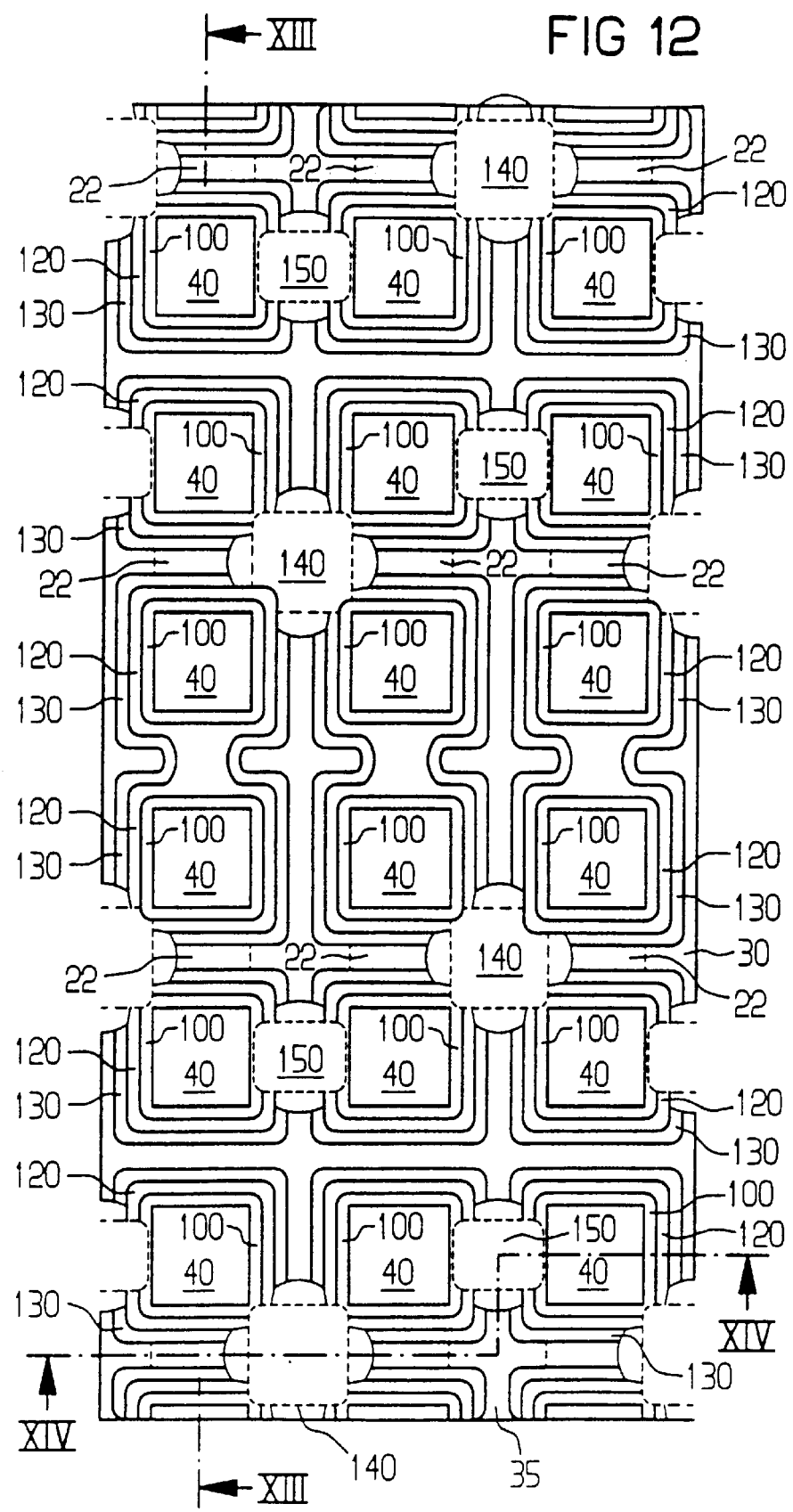
FIG. 12 is a plan view of the semiconductor substrate after isotropic etching of polycrystalline silicon.
Figure 13:
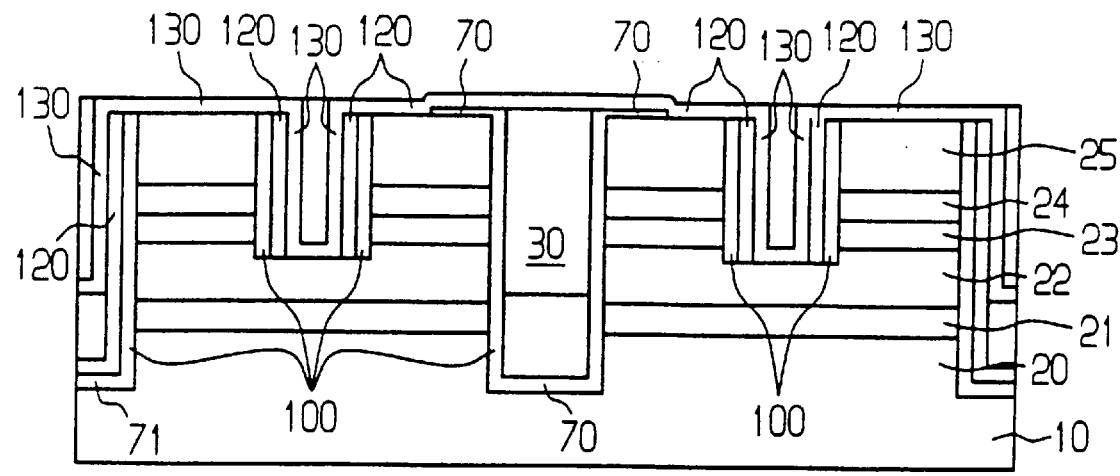
FIG. 13 is a cross-sectional view through the semiconductor substrate illustrated in FIG. 12 along the line XIII—XIII.
Figure 14:
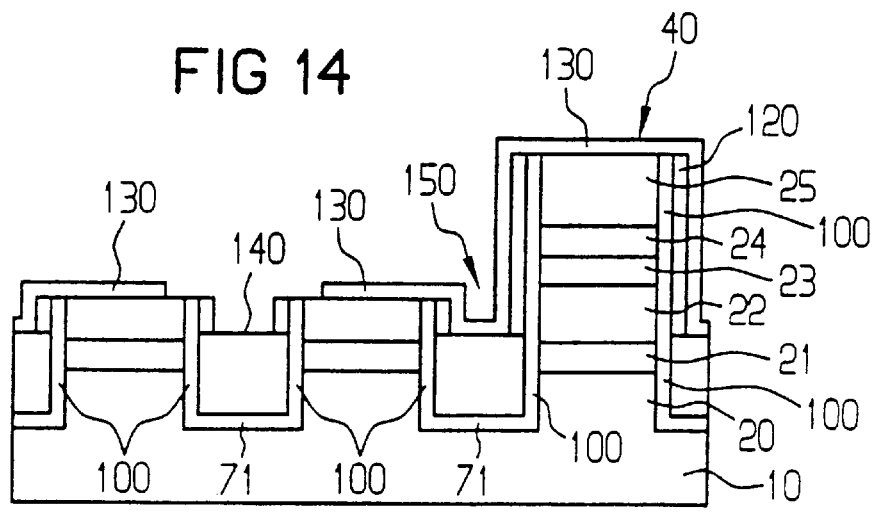
FIG. 14 is a cross-sectional through the semiconductor substrate illustrated in FIG. 12 along the line XIV—XIV.

In the next process step, the trenches 30 and 35 are filled with a suitable filling material such as tetraethyl orthosilicate (TEOS) or borophosphorus silicate glass (BPSG). The trenches are then planarized, preferably by a process of chemical mechanical planarization (CMP), the planarization operation being carried out on the topmost plane of the heavily doped polycrystalline semiconductor material 130. Afterwards, a resist mask is again applied and subsequently exposed. The resist mask is once again aligned with an accuracy of, preferably, at least 0.2 F. Zones 140 and 150 are opened as a result of this operation (see FIGS. 12–14). The filling material is then etched selectively with respect to the preferably polycrystalline semiconductor material 130, for example using dilute hydrofluoric acid, down to the lower plane of the semiconductor material 130. The etching operation is carried out in a self-aligned manner. The semiconductor material 130 forms a lateral and lower etching stop. The topmost regions, preferably the topmost 100 nm of the semiconductor material 130, i.e. preferably of the polycrystalline silicon, are subsequently removed by etching. The semiconductor material 130 is completely removed in the uncovered pockets 140 and 150. The state of the semiconductor substrate that is reached as a result of this is illustrated in FIGS. 12, 13 and 14.

Figure 15:
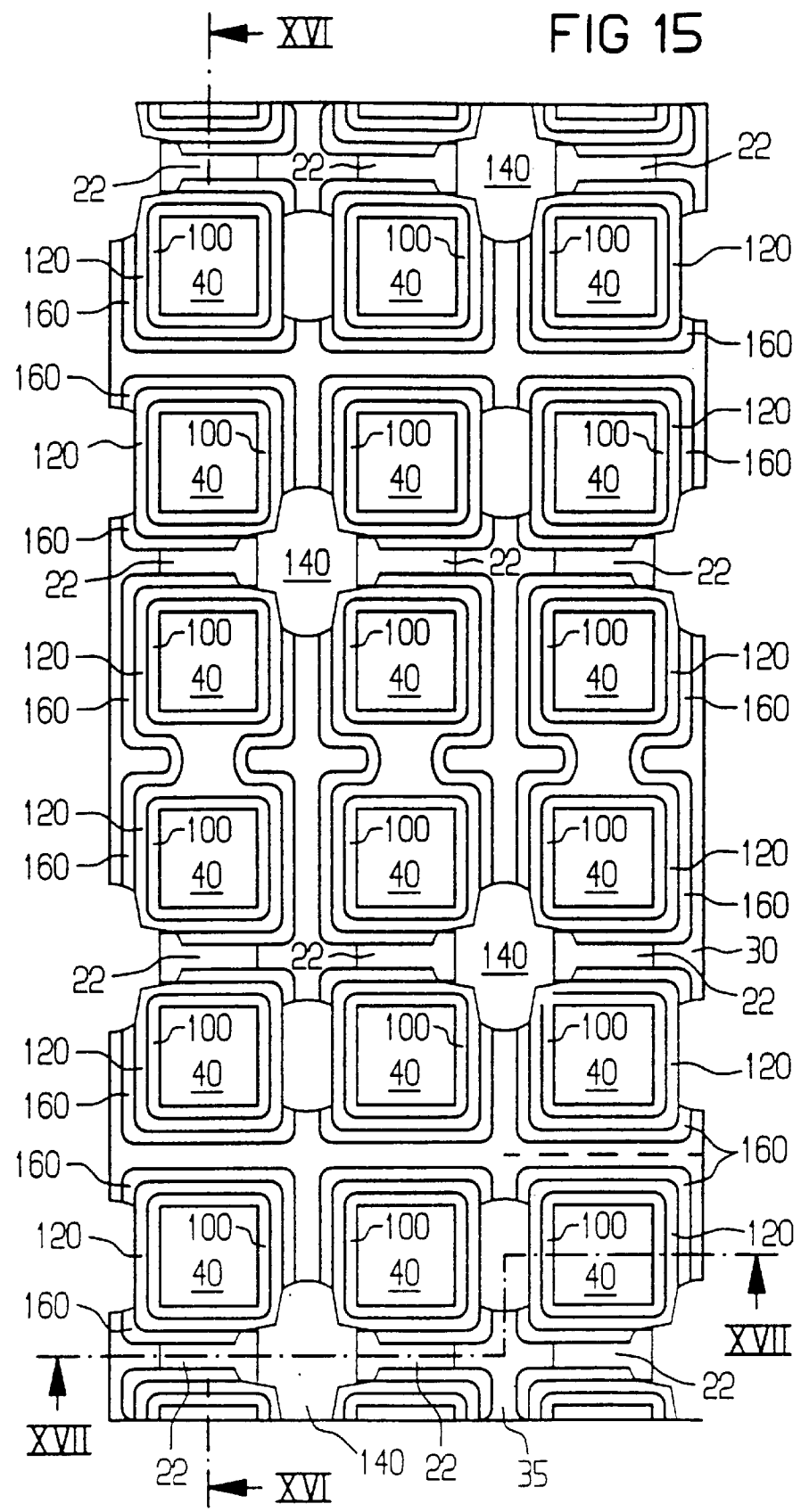
FIG. 15 is a plan view of the semiconductor substrate after additional anisotropic etching of the polycrystalline silicon.
Figure 16:
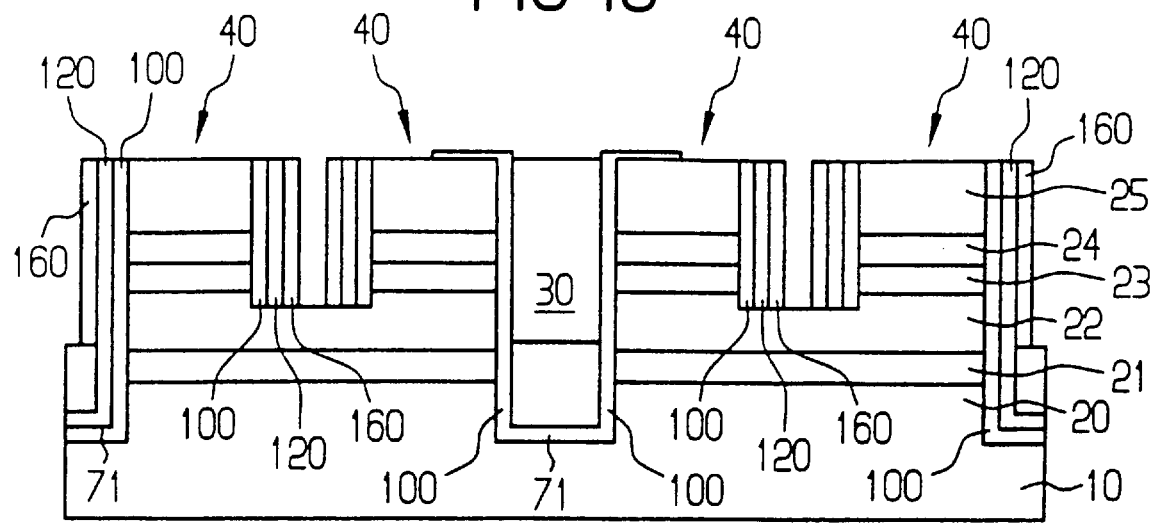
FIG. 16 is a cross-sectional view through the semiconductor substrate illustrated in FIG. 15 along the line XVI—XVI.
Figure 17:
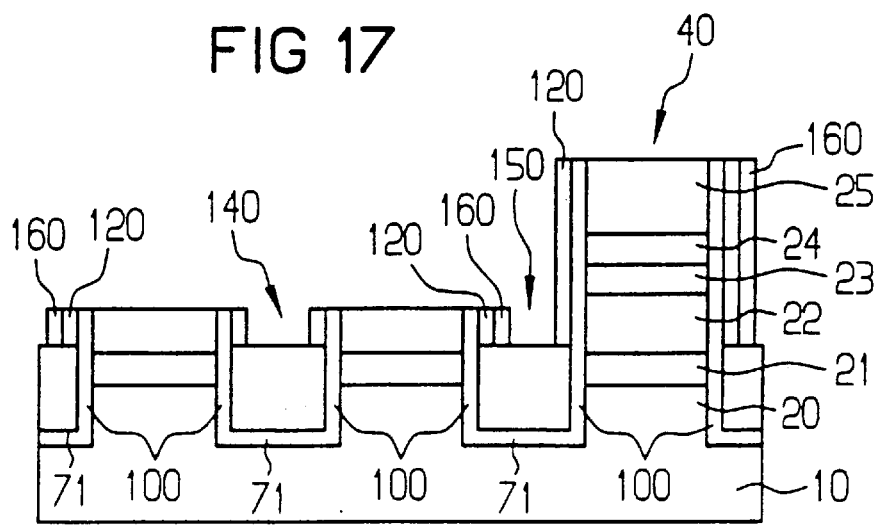
FIG. 17 is a cross-sectional view through the semiconductor substrate illustrated in FIG. 15 along the line XVII—XVII.

After the removal of the resist mask and anisotropic etching of the semiconductor material, only spacers 160 of the semiconductor material 130 remain. This state of the semiconductor substrate is illustrated in FIGS. 15, 16 and 17.

Figure 18:
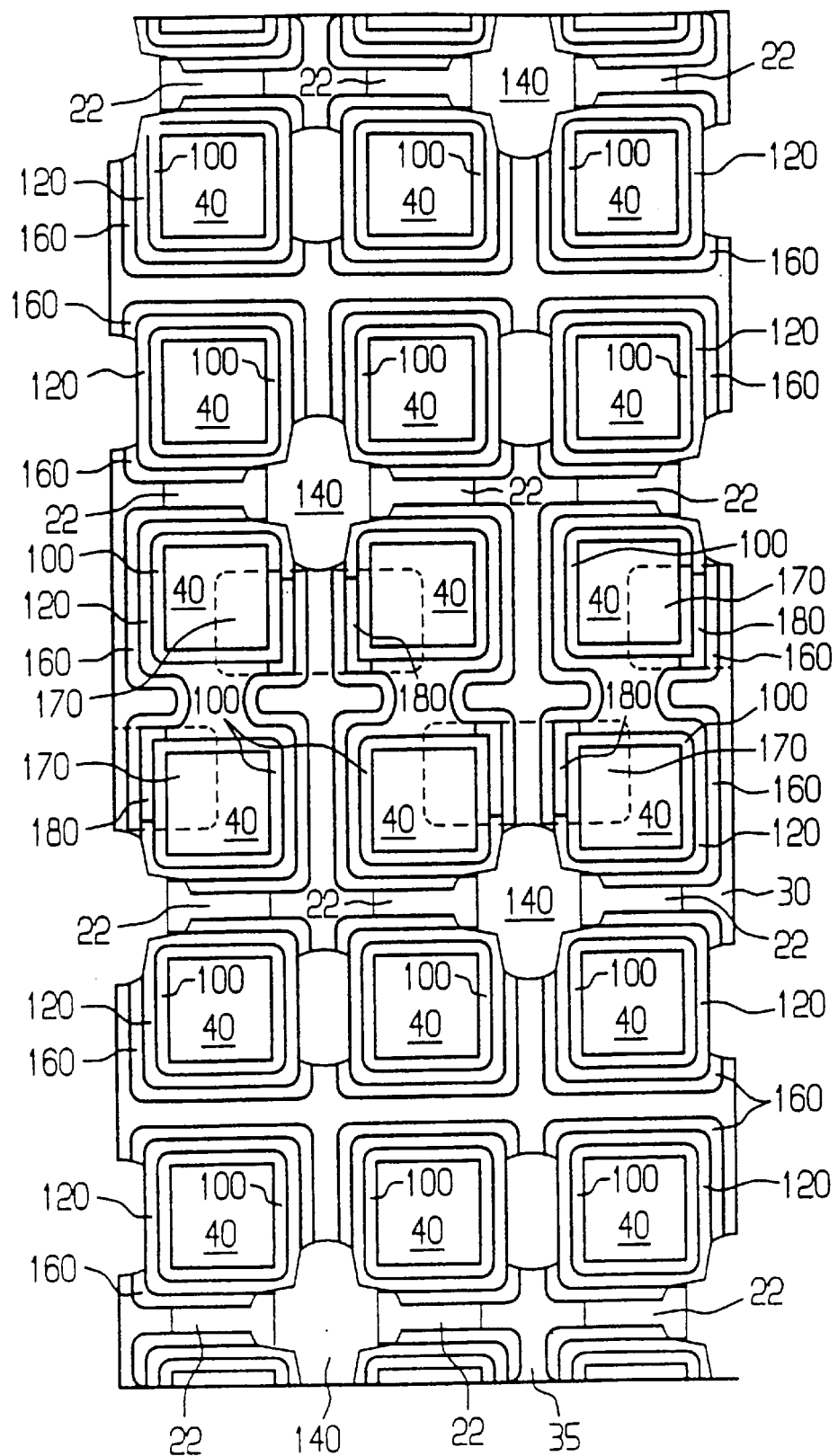
FIG. 18 is a plan view of the semiconductor substrate after planarization of a surface, patterning and deposition of a heavily doped layer made of polycrystalline silicon for the purpose of forming connecting lines.

The upper surface of the semiconductor layer 25, i.e. the structure plane 5, is subsequently planarized. The planarization is likewise preferably effected by a process of chemical mechanical planarization (CMP). A resist mask is subsequently applied by the application of resist and exposure. The alignment of the resist mask is once again effected with an accuracy of, preferably, at least 0.2 F. The resist mask covers the entire semiconductor substrate with the exception of zones 170. Approximately 200 nm of the insulation material $SiO_2$ are subsequently etched selectively with respect to nitride and the semiconductor material, preferably silicon. An $n^+$-doped semiconductor material, preferably polycrystalline silicon, is subsequently deposited to a thickness of approximately 30 nm. The deposition is carried out for example in an atmosphere containing silane $SiH_4$ and phosphorus. The semiconductor material fills interspaces of the removed insulation material. These interspaces are narrow. Their lateral extent amounts to approximately 50 nm. The semiconductor material is subsequently etched, approximately 30 nm of the semiconductor material being removed. As a result of this, the semiconductor material deposited last is removed, with the exception of narrow columns 180 having a thickness of, preferably, less than 60 nm. The columns 180 filled with the semiconductor material deposited last serve as gate electrodes in the completed integrated electrical circuit. Subsequent removal of the resist mask produces a state as illustrated in FIG. 18.

After subsequent planarization of the surface on the structure plane 5, a further application of a resist mask is effected by application of resist and exposure in all regions of the semiconductor substrate with the exception of regions 200. The resist mask is once again aligned with an accuracy that is preferably better than 0.2 F.

Figure 20:
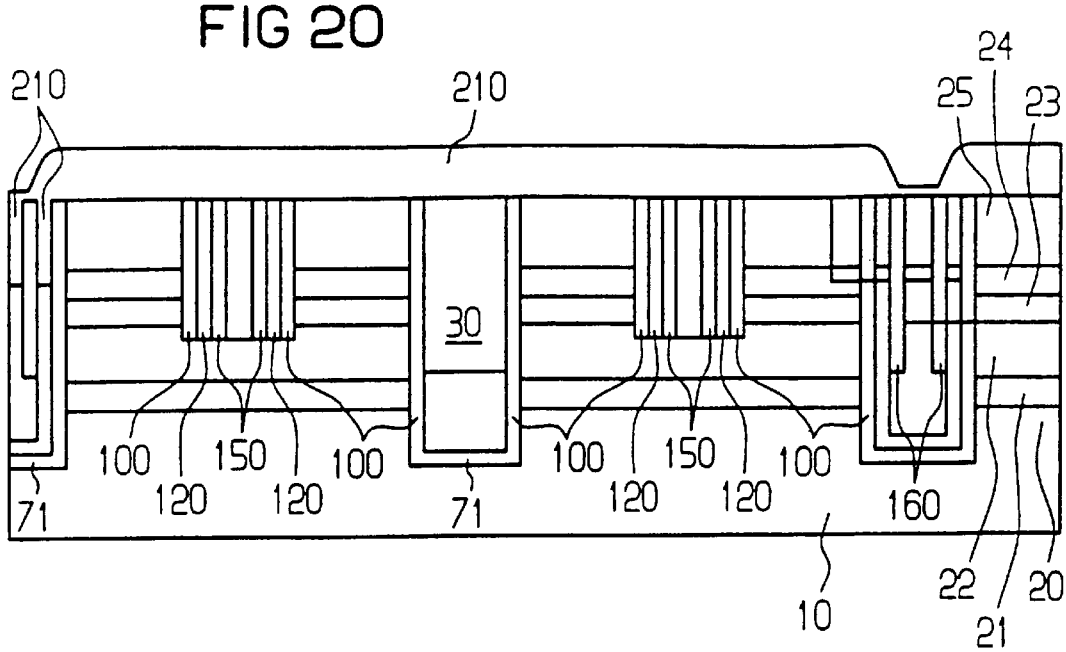
FIG. 20 is a cross-sectional view through the semiconductor substrate illustrated in FIG. 19 along the line XX—XX.
Figure 21:
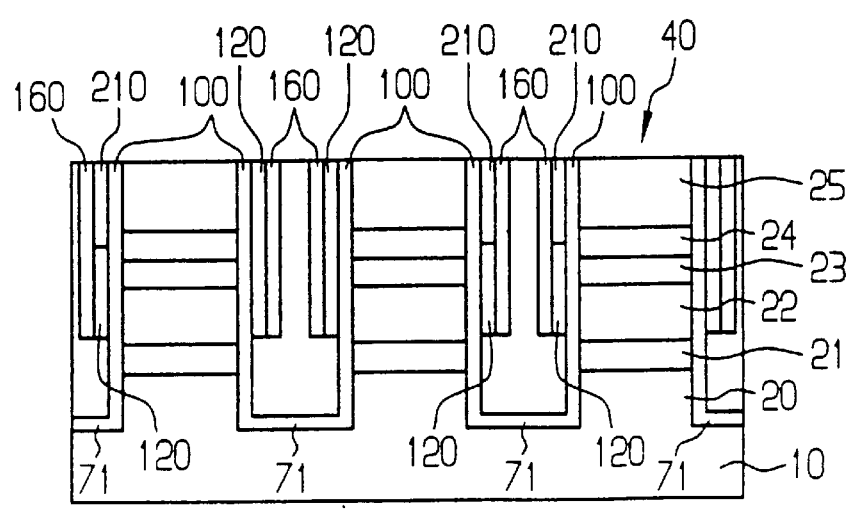
FIG. 21 is a cross-sectional view through the semiconductor substrate illustrated in FIG. 19 along the line XXI—XXI.

After etching of $SiO_2$ selectively with respect to nitride and the semiconductor material, preferably silicon, trenches are etched into the $SiO_2$ in the regions 200. The depth of the trenches is of the order of magnitude of 100 nm. Afterwards, the resist is removed and heavily doped, for example $n^+$-doped, semiconductor material 210, preferably polycrystalline silicon, is deposited to the thickness of the trenches in the regions 200, i.e. preferably to a thickness of 100 nm. The deposition may be carried out for example by the chemical vapor deposition (CVD) process. The heavily doped semiconductor material 210 serves to establish electrical contacts. This state can be seen in the sectional diagram illustrated in FIG. 20.

Figure 19:
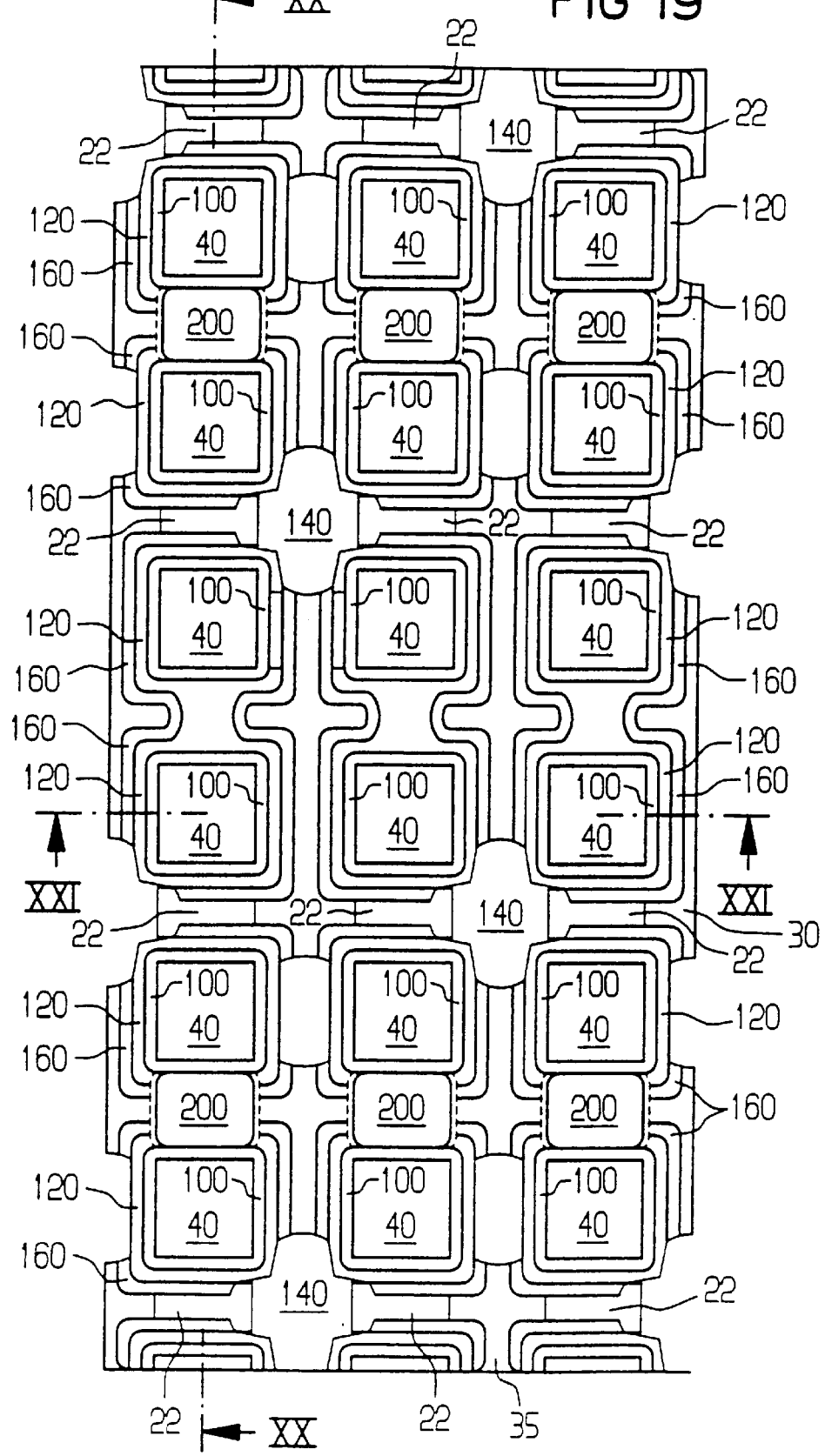
FIG. 19 is a plan view of the semiconductor substrate after planarization of the top surface, and etching of trenches into an oxide layer.
Figure 22:
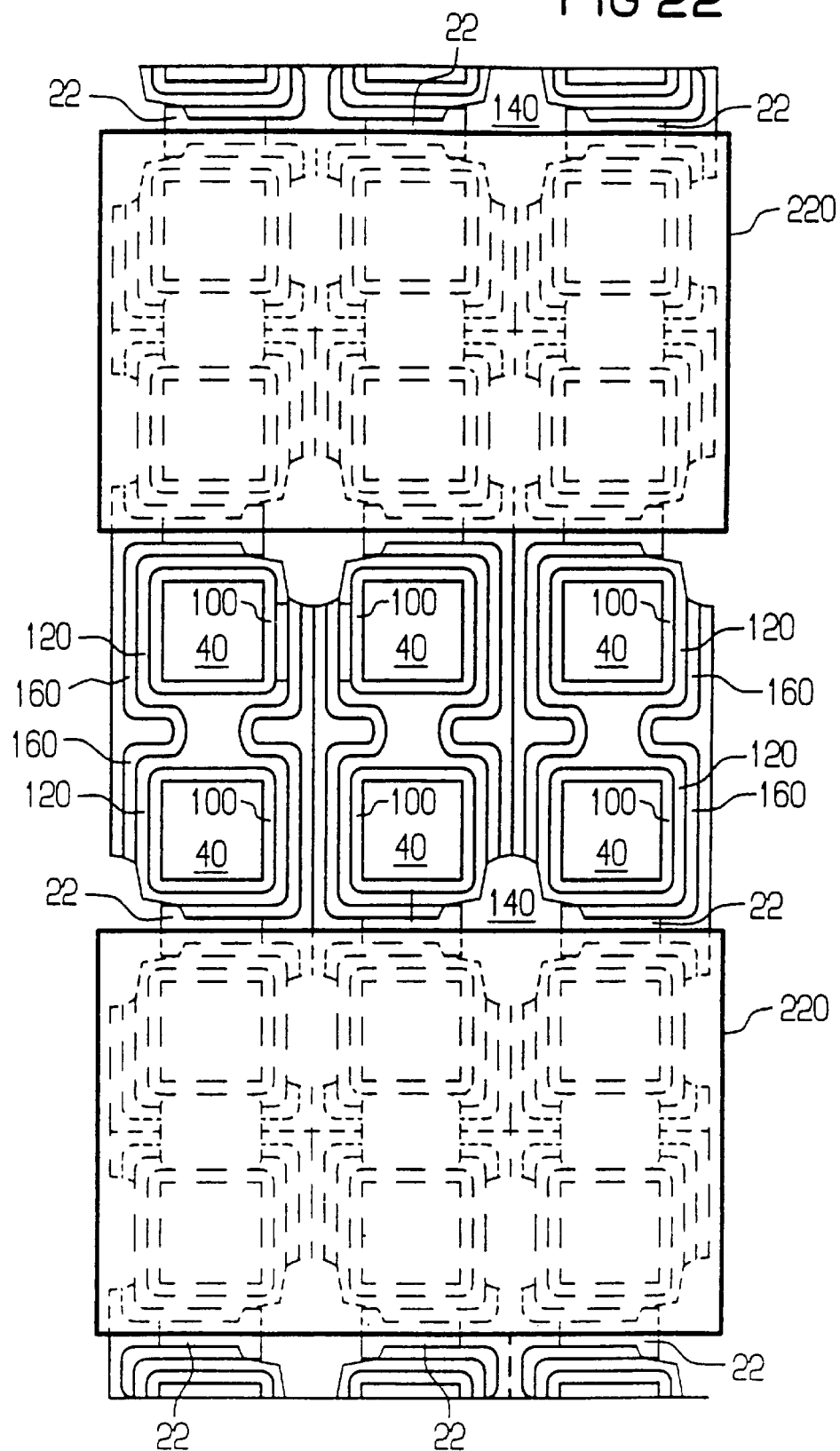
FIG. 22 is a plan view of the semiconductor substrate after the application and patterning of a mask.

The plan view of the semiconductor substrate after the planarization of the surface on the plane 5 by a chemical mechanical polishing process (CMP) is illustrated in FIG. 19. With regard to the semiconductor material deposited last, this planarization process leaves behind only that part which is situated in the previously etched trenches in the regions 200. As the next process step, an insulation material 220, preferably $Sio_2$, is deposited to a thickness of approximately 50 nm, and this can preferably be done by a CVD process. The insulation material 220 serves as a mask for nitride etching which takes place in a later process step (see FIG. 22).

The alignment of the insulation material 220 forming a mask is once again effected with an accuracy of, preferably, better than 0.2 F. However, such an alignment accuracy is only necessary vertically with respect to the insulation material 220 in strip form. Approximately 50 nm of the insulation material 220, i.e. preferably of the $SiO_2$, are subsequently removed. By etching with phosphoric acid, the nitride layer 72 and the nitride sidewalls are etched selectively with respect to the insulation layer, preferably an oxide, and the semiconductor layer, preferably a silicon layer. The etching reaches down into the region between the semiconductor layers 21 and 22. The semiconductor substrate that has been treated in this way is illustrated in plan view in FIG. 22.

Afterwards, the insulation material 220 that served as a mask for the nitride etching is isotropically removed.

Figure 23:
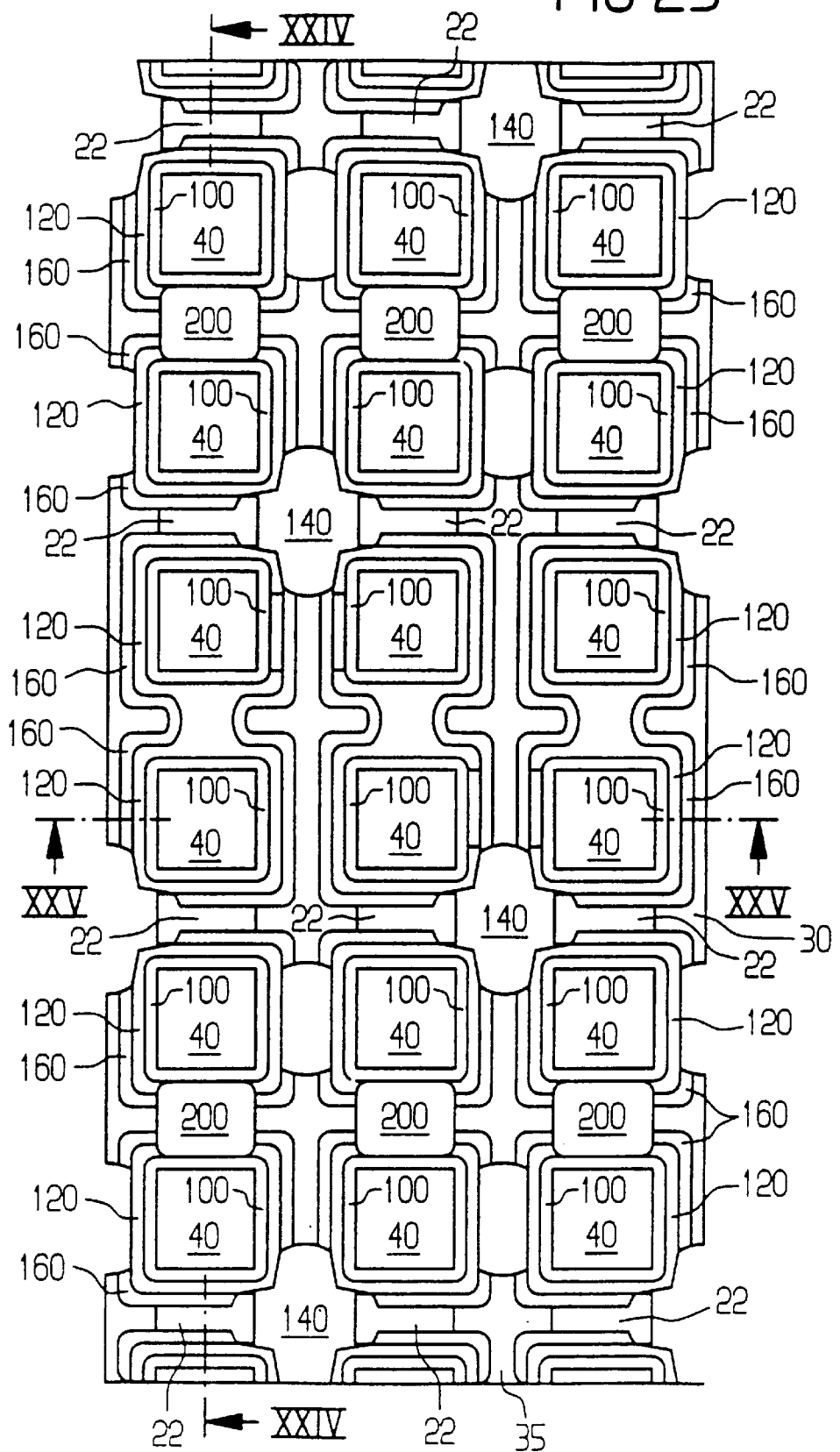
FIG. 23 is a plan view of the semiconductor substrate after the removal of the mask and formation of a gate dielectric.
Figure 24:
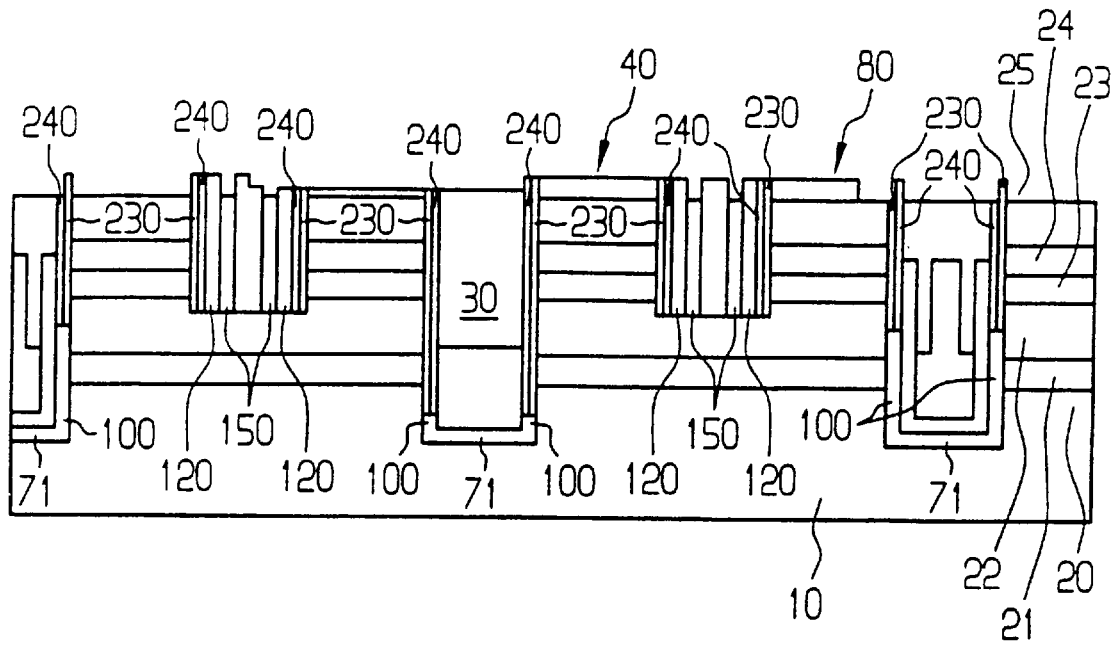
FIG. 24 is a cross-sectional view through the semiconductor substrate illustrated in FIG. 23 along the line XXIV—XXIV.
Figure 25:
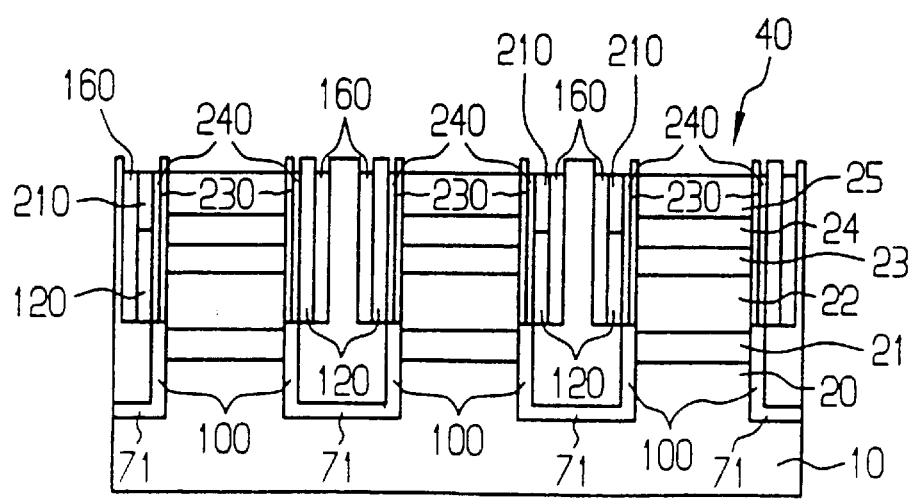
FIG. 25 is a cross-sectional view through the semiconductor substrate illustrated in FIG. 23 along the line XXV—XXV.

A gate dielectric 230 is subsequently produced by oxidation of the semiconductor material to a depth of approximately 10 nm. The columns produced during the nitride etching are filled by the deposition of n+-doped semiconductor material 240, preferably polycrystalline silicon, to a thickness of approximately 50 nm. The semiconductor material deposited last is then removed. It is preserved only in the columns. The semiconductor surfaces are etched back behind the insulation material and the nitride layer. The state thus explained is illustrated in FIGS. 23, 24 and 25.

Two MOS transistors lying one above the other and also, in addition, selection transistors have been fabricated in the region of the layer stacks 40 in the manner explained.

A first plane having metal lines is subsequently applied, the metal lines, in order to be formed as word lines W, are provided with contacts to the gate region of the selection transistors. In this case, a contact is effected into the n+-doped semiconductor material.

Figure 26:
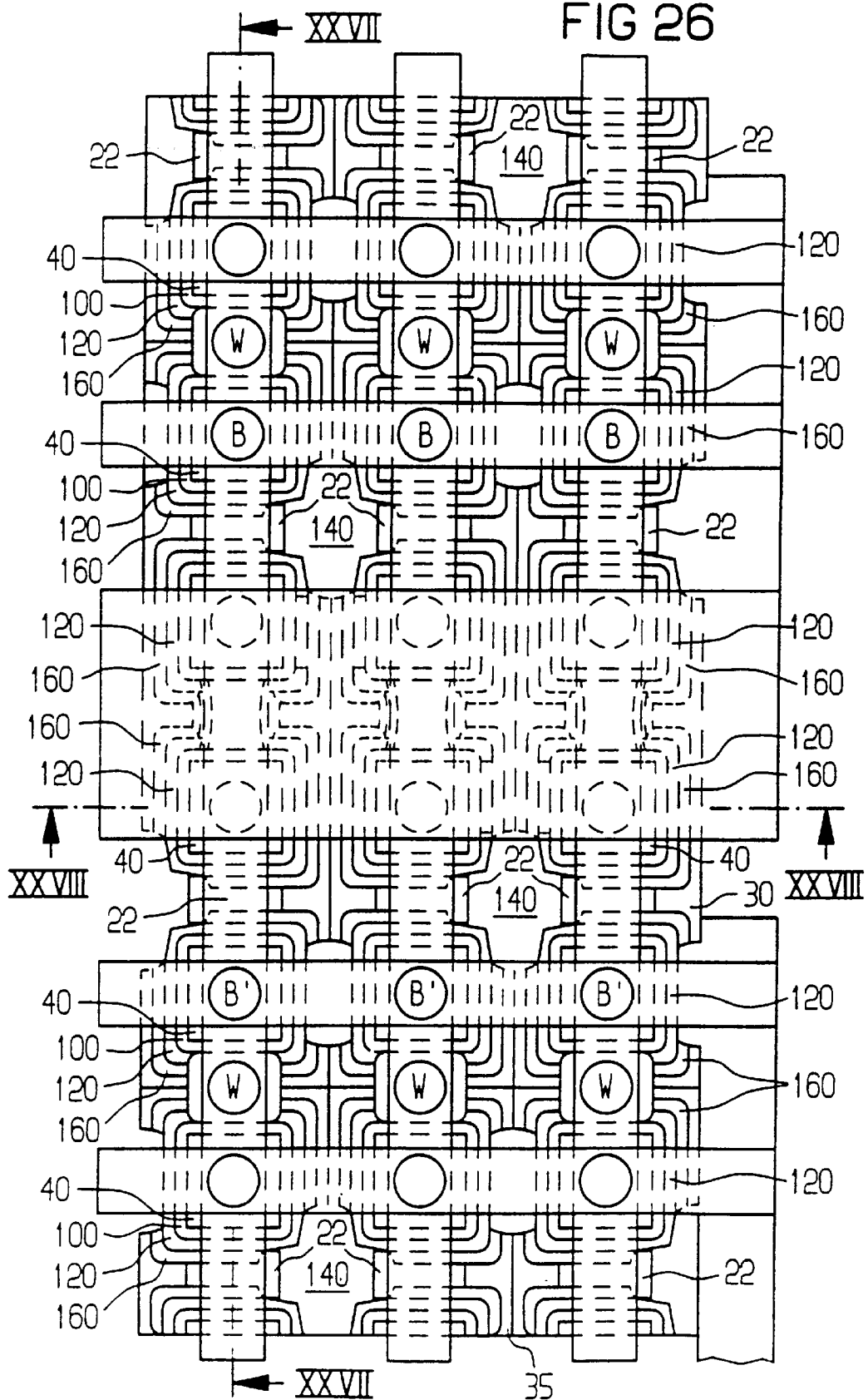
FIG. 26 is a plan view of the completed integrated electrical circuit after the provision of word lines and bit lines.
Figure 27:
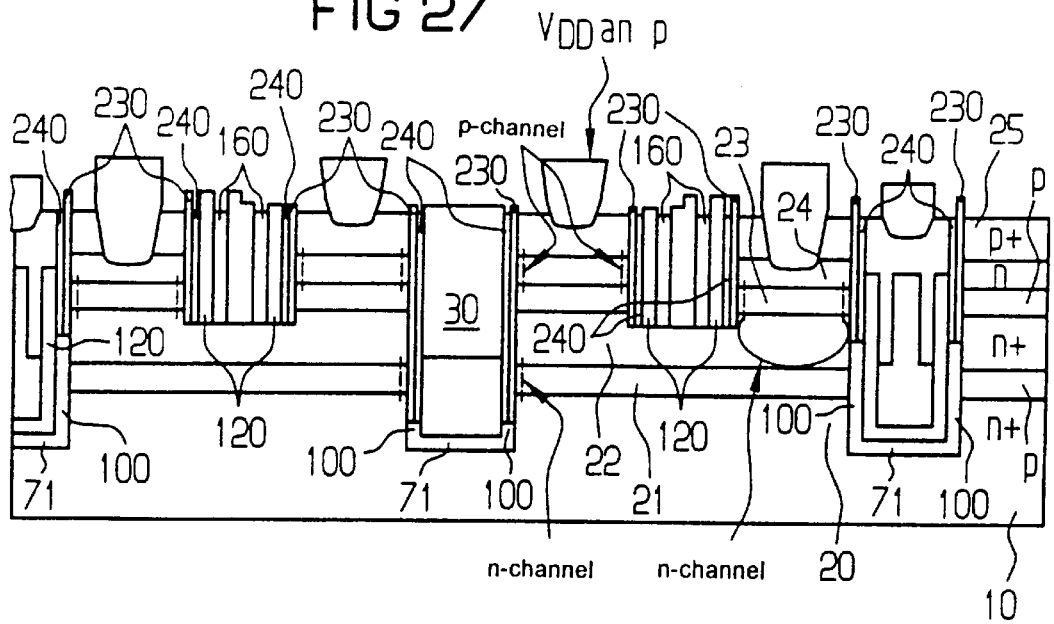
FIG. 27 is a cross-sectional view through the integrated electrical circuit illustrated in FIG. 26 along the line XXVII—XXVII.
Figure 28:
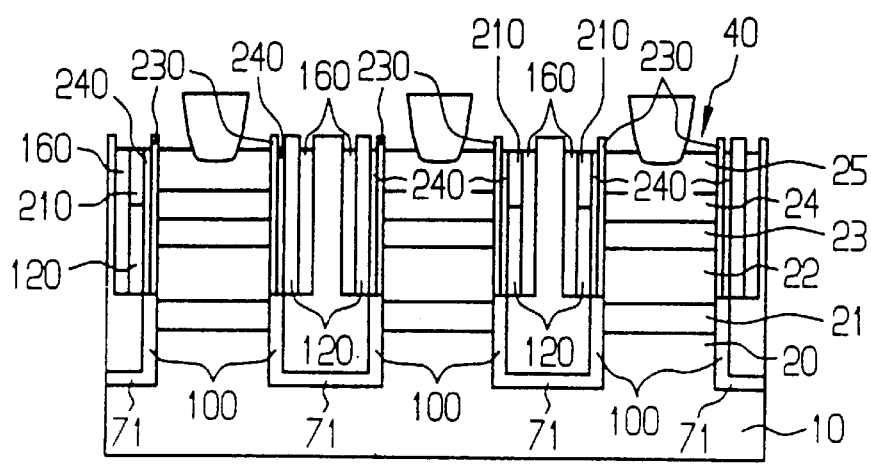
FIG. 28 is a cross-sectional view through the integrated electrical circuit illustrated in FIG. 26 along the line XXVIII—XXVIII.

A second plane having metal lines for bit lines B, B' is subsequently applied. The bit lines B, B' are connected to the topmost, $p^+$-doped plane. The integrated electrical circuit fabricated in this way is illustrated in FIGS. 26, 27 and 28.

Figure 29:
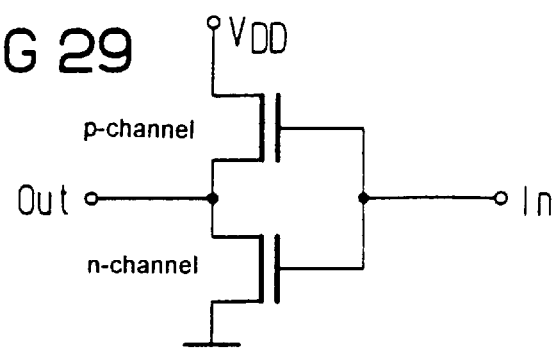
FIG. 29 is a circuit diagram of a CMOS inverter.
Figure 30:
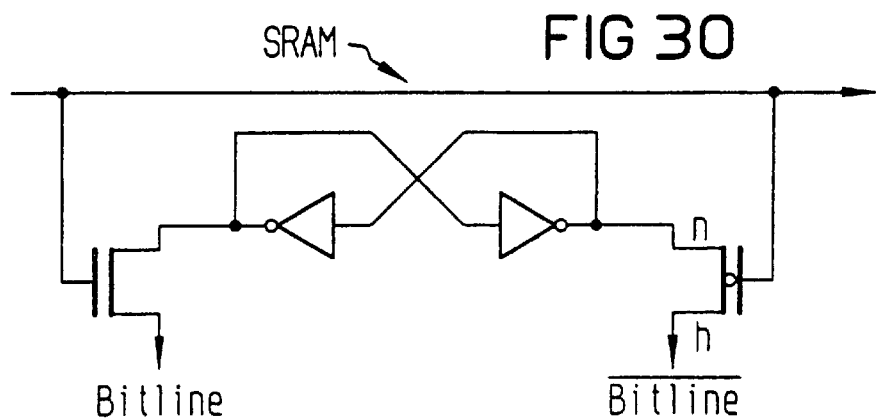
FIG. 30 is a circuit diagram of an SRAM.

A circuit diagram of a CMOS inverter that is part of an integrated electrical circuit is illustrated in FIG. 29. The circuit diagram of the finished SRAM cell containing six transistors is illustrated in FIG. 30.

Figure 31:
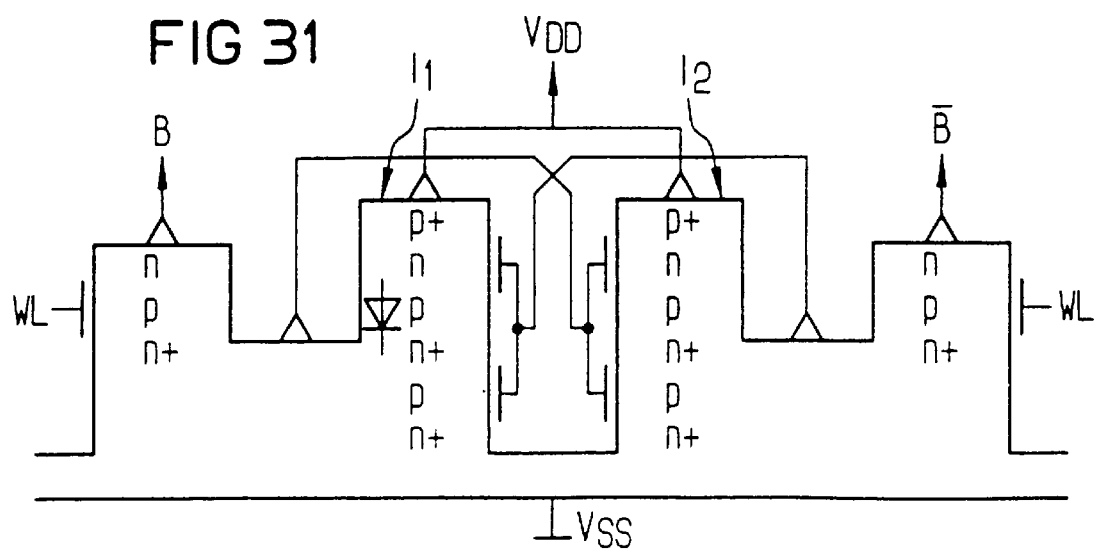
FIG. 31 is a schematic sketch for elucidating the wiring of the planes in the SRAM.

In the schematic representation reproduced in FIG. 31, the SRAM cell has 6 transistors. Two respective complementary MOS transistors are situated in two coupled CMOS inverters. Two selection transistors are situated at a distance from the two inverters. The SRAM cell illustrated in FIG. 31 is preferably situated at the crossover point of a word line WL and a pair of two bit lines B, B'. In the manner illustrated, the SRAM cell is configured as a bistable flip-flop with two selection transistors. An inverter is formed in this way, the outputs of which inverter are identical to the storage nodes of the memory cell. The flip-flop has two stable states. In one state, one storage node is at the potential of 0 volts, while another storage node is at the $V_{DD}$ potential. In the other stable state, the first storage node is at the $V_{DD}$ potential, while the second storage node is at the 0 volts potential. As long as the supply voltage $V_{DD}$ is applied, the storage state is temporally stable. Static storage is involved in this case.

Random access is enabled by the connection with two bit lines and a word line. It is particularly expedient to fabricate the word lines and bit lines using a metal, since the conduction resistances of these lines have to be smaller than the resistances in other regions of the electrical circuit.

The way in which the fabrication of a static memory cell can be integrated into the CMOS basic process has been explained. The method according to the invention is thus distinguished by its ready integrability into the process sequence for fabricating the integrated circuit. This good fabrication capability is simultaneously associated with a particularly small area occupation both for the individual memory cell and for the integrated electrical circuit in which it is contained.

We claim:

1. An integrated electrical circuit, comprising:

a semiconductor substrate having a surface;

a memory cell disposed in a region of said surface of said semiconductor substrate and having inverters electrically connected to one another, said inverters each containing two complementary MOS transistors each having a source, a drain and a channel, and said channel of each of said two complementary MOS transistors having different conductivity types, said memory cell, including:

a first doped semiconductor layer disposed on said semiconductor substrate;

a second doped semiconductor layer disposed on said first doped semiconductor layer;

a third doped semiconductor layer disposed on said second doped semiconductor layer;

a fourth doped semiconductor layer disposed on said third doped semiconductor layer;

a fifth doped semiconductor layer disposed on said fourth doped semiconductor layer;

and a sixth doped semiconductor layer disposed on said fifth doped semiconductor layer, said first doped semiconductor layer, said second doped semiconductor layer, said third doped semiconductor layer, said fourth doped semiconductor layer, said fifth doped semiconductor layer and said sixth doped semiconductor layer defining a layer sequence doped alternately with opposite conductivity types;

said layer sequence having a grid of rectangular trenches formed therein, said grid of rectangular trenches reaching down into said semiconductor substrate and said grid of rectangular trenches defining at least two layer assemblies each having side walls;

said at least two layer assemblies each having a further trench formed therein, said further trench reaching down into said third doped semiconductor layer and connecting two mutually opposite rectangular trenches of said grid of rectangular trenches to one another in a respective layer assembly;

said inverters are disposed on mutually opposite side walls of said side walls of said at least two layer assemblies, said first doped semiconductor layer, said second doped semiconductor layer and said third doped semiconductor layer in each case forming said source, said channel and said drain of one of said two complementary MOS transistors of a respective inverter and said fourth doped semiconductor layer, said fifth doped semiconductor layer and said sixth doped semiconductor layer in each case forming said source, said channel and said drain of another of said two complementary MOS transistors of the respective inverter;

two selection transistors each having a source, a channel and a drain and disposed in each case on a side of the respective layer assembly which is remote from said inverters, said source, said channel and said drain of each of said two selection transistors formed by said third doped semiconductor layer, said fourth doped semiconductor layer and said fifth doped semiconductor layer; and said further trench disposed in said layer sequence in each case formed between one of said two selection transistors and one of said inverters.

2. The integrated electrical circuit according to claim 1, including:

two bit lines, said fifth doped semiconductor layer connected to one of said two bit lines in each case in a region of said two selection transistors;

a supply voltage line connected to said sixth doped semiconductor layer in a region of said inverters; and a word line, said two selection transistors each have a gate electrode connected to said word line.

3. The integrated electrical circuit according to claim 2, wherein said gate electrode of each of said two selection transistors disposed partly in said further trench of one of said at least two layer assemblies, said two complementary MOS transistors of each of said inverters each having a gate electrode disposed partly in one of said rectangular trenches.

4. The integrated electrical circuit according to claim 3, wherein said gate electrode of each of said two selection transistors annularly surrounding those parts of said third doped semiconductor layer, said fourth doped semiconductor layer and said fifth doped semiconductor layer forming a respective selection transistor.

5. The integrated electrical circuit according to claim 1, wherein said first doped semiconductor layer is part of said semiconductor substrate.

* * * * *